United States Patent
Kawasaki

(10) Patent No.: US 8,943,333 B2
(45) Date of Patent: Jan. 27, 2015

(54) LARGE SCALE INTEGRATED CIRCUIT FOR DYNAMICALLY CHANGING RESONANT POINT

(75) Inventor: Kenichi Kawasaki, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 1182 days.

(21) Appl. No.: 12/244,242

(22) Filed: Oct. 2, 2008

(65) Prior Publication Data

US 2009/0091370 A1    Apr. 9, 2009

(30) Foreign Application Priority Data

Oct. 4, 2007 (JP) ................ 2007-260871

(51) Int. Cl.
*G06F 1/00* (2006.01)
*H03J 3/20* (2006.01)

(52) U.S. Cl.
CPC ........................ *H03J 3/20* (2013.01)
USPC .......................... 713/300; 713/322

(58) Field of Classification Search
USPC ........................ 713/300, 322, 302
See application file for complete search history.

(56) References Cited

U.S. PATENT DOCUMENTS

| 5,555,225 A * | 9/1996 | Hayashi et al. ............. 368/10 |
| 5,632,040 A * | 5/1997 | Nakajima ................ 713/322 |
| 5,721,887 A | 2/1998 | Nakajima |
| 6,057,729 A * | 5/2000 | Nomura .................. 327/592 |
| 2004/0019815 A1* | 1/2004 | Vyssotski et al. ........... 713/322 |
| 2004/0123166 A1* | 6/2004 | Gauthier et al. ............ 713/300 |
| 2005/0206464 A1* | 9/2005 | McCorquodale et al. 331/107 A |
| 2006/0017519 A1* | 1/2006 | Pernia et al. ................ 331/185 |
| 2007/0074055 A1* | 3/2007 | McCall et al. ............... 713/300 |
| 2007/0195483 A1 | 8/2007 | Asano |

FOREIGN PATENT DOCUMENTS

| JP | 08-32026 A | 2/1996 |
| JP | 11-7330 A | 1/1999 |
| JP | 2003-258612 A | 9/2003 |
| JP | 2007-221046 A | 8/2007 |

* cited by examiner

*Primary Examiner* — Nimesh G Patel
(74) *Attorney, Agent, or Firm* — Arent Fox LLP

(57) ABSTRACT

The semiconductor intergrated circuit comprises: a circuit that executes a predetermined process and a switching circuit that selects a power impedance, The switching circuit selects the power impedance, in accordance with a variation in voltage supplied to the circuit, so that a resonant frequency of the semiconductor integrated circuit is different from a operation frequency of the circuit.

16 Claims, 27 Drawing Sheets

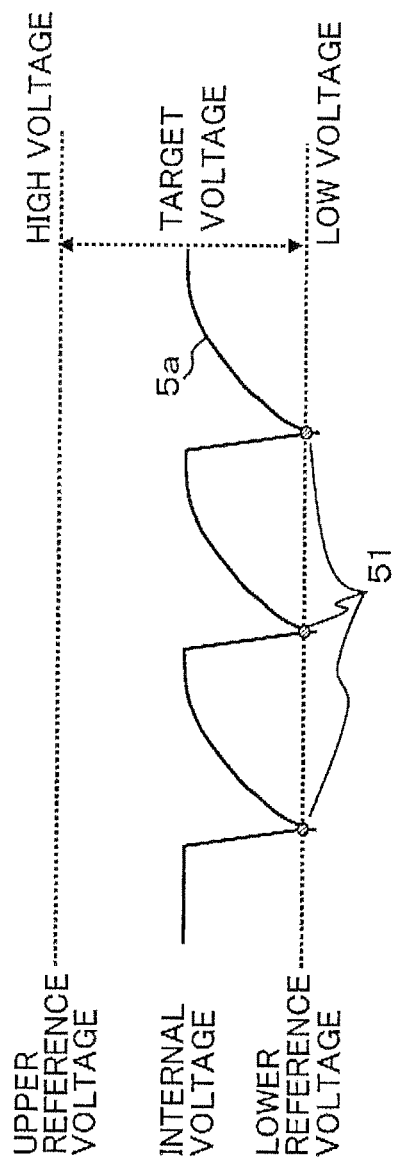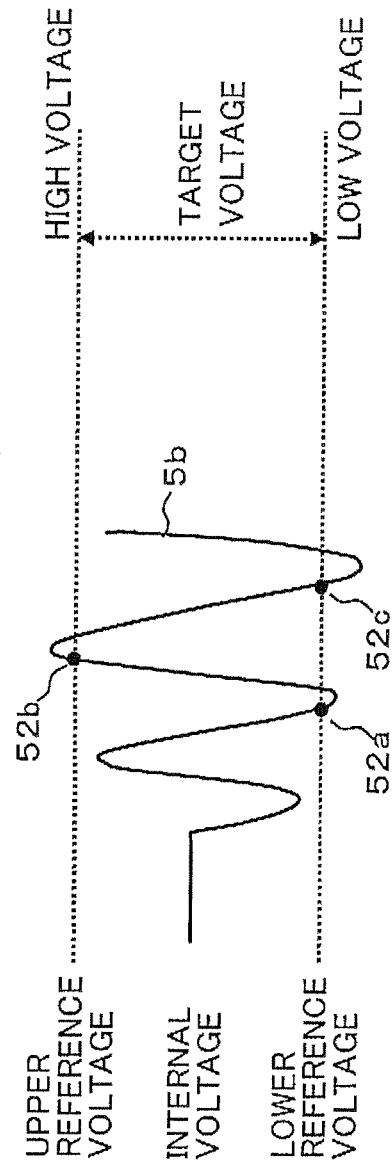

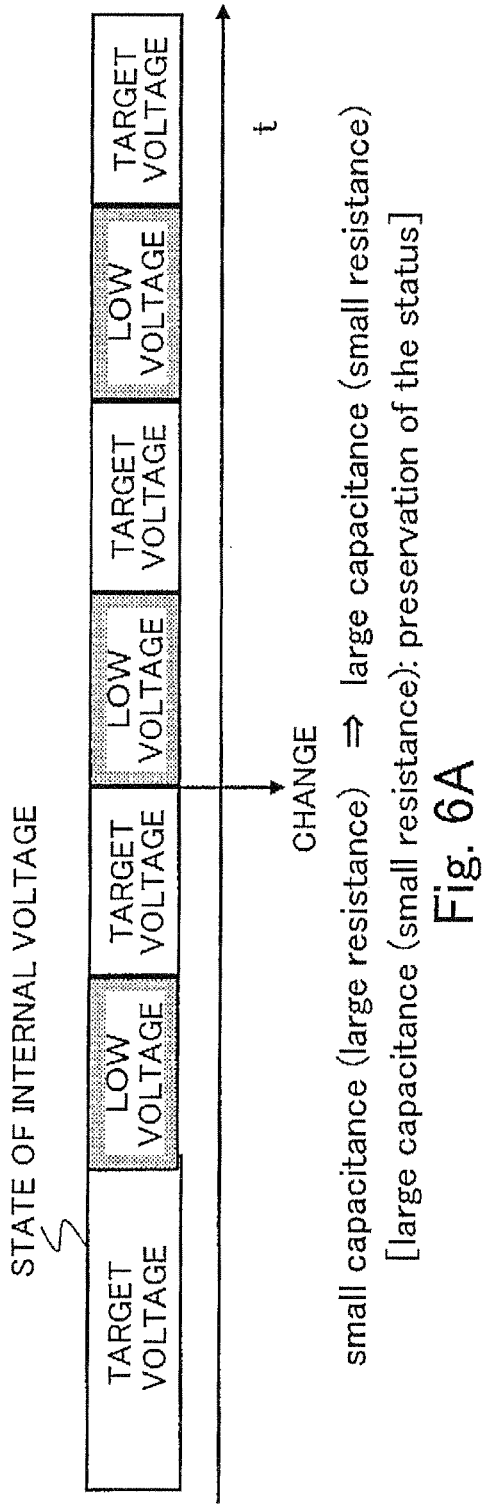
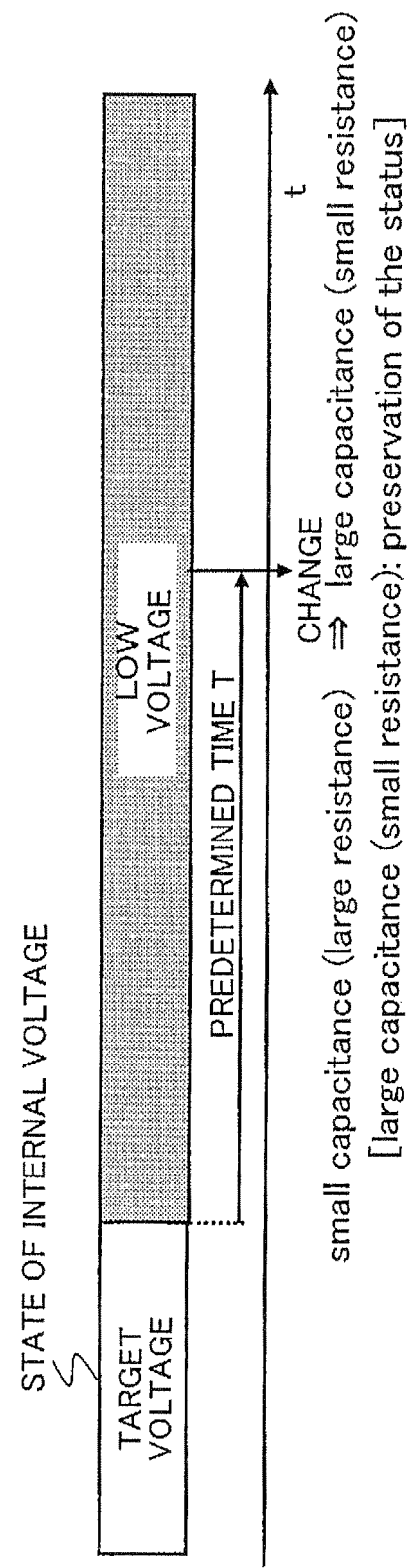

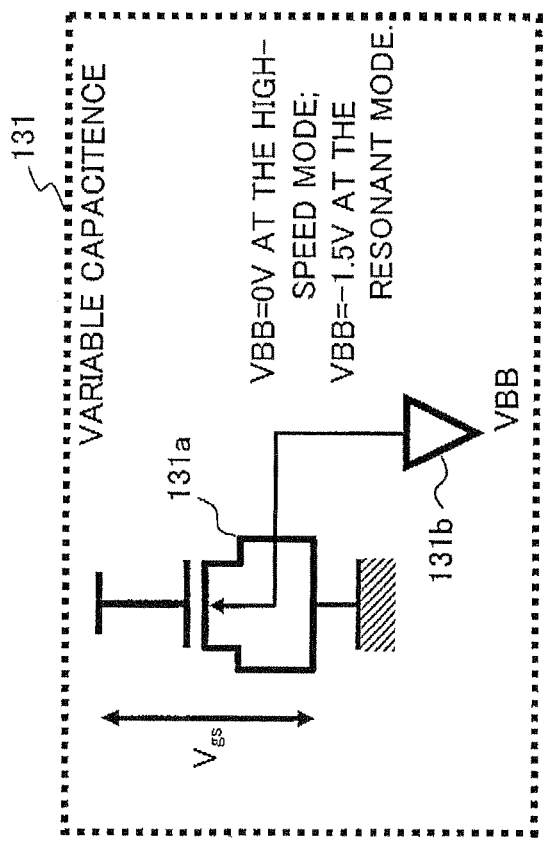
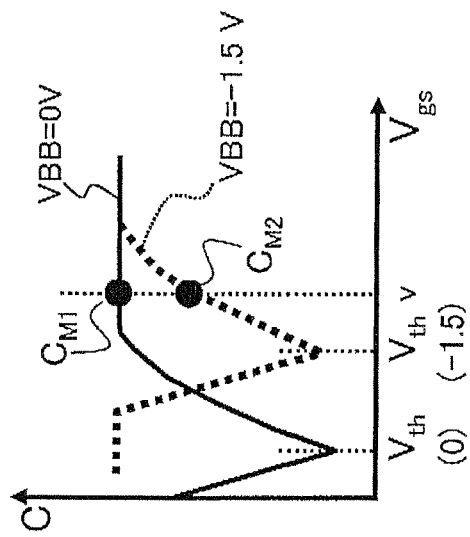
Fig. 10A
Fig. 10B

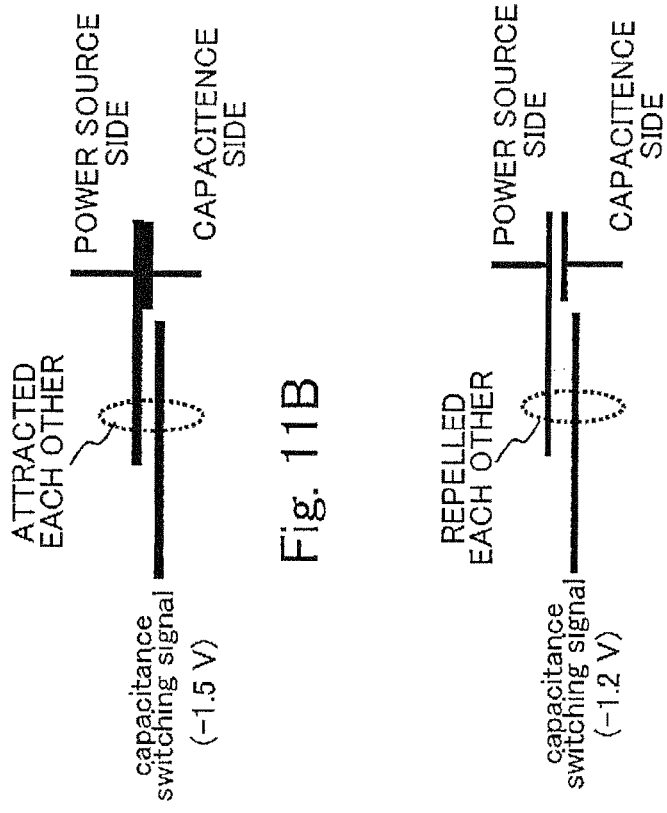
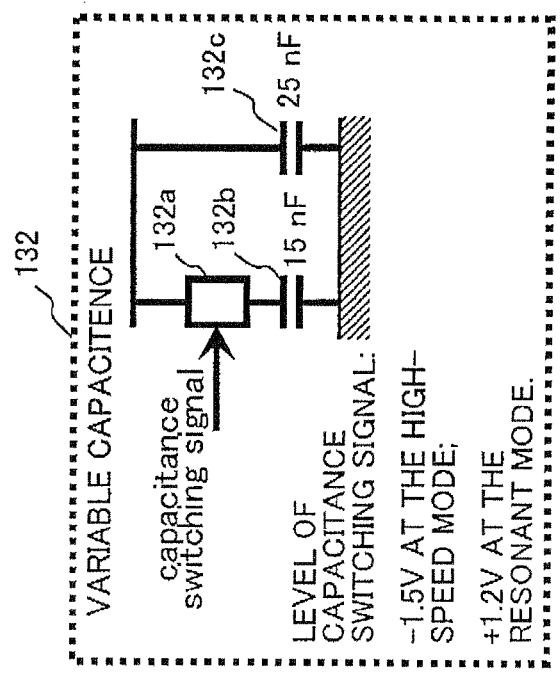
Fig. 11A
Fig. 11B
Fig. 11C

| VOLTAGE LEVEL | DATA ON MONITORING INTERNAL VOLTAGE | | | | CONTROL OF SWITCHING |
| --- | --- | --- | --- | --- | --- |
| | a | b | c | d | |
| ULTRA-HIGH VOLTAGE | 1 | 1 | 1 | 1 | INTERLOCKING |
| HIGH VOLTAGE | 0 | 1 | 1 | 1 | EXECUTEING SWITCHING |
| TARGET VOLTAGE | 0 | 0 | 1 | 1 | KEEPING THE STATE |
| LOW VOLTAGE | 0 | 0 | 0 | 1 | EXECUTEING SWITCHING |
| ULTRA-LOW VOLTAGE | 0 | 0 | 0 | 0 | INTERLOCKING |

Fig. 16

LARGE SCALE INTEGRATED CIRCUIT FOR DYNAMICALLY CHANGING RESONANT POINT

CROSS-REFERENCE TO RELATED APPLICATIONS

This application claims the benefit of priority from Japanese Patent Application No. 2007-260871 filed on Oct. 4, 2007, the entire contents of which are incorporated herein by reference.

BACKGROUND OF THE INVENTION

1. Field of the Invention

This application relates to a large scale integrated circuit that suppresses power noise.

2. Description of the Related Art

Recently, in response to a request for low power consumption, such a technology has been used that the operation frequency is dynamically changed depending on the usage situation of a large scale integrated circuit (hereinafter, referred to as an LSI) and unnecessary power consumption is reduced. For example, when the LSI is not frequently used, a clock frequency is dropped close up to the operation frequency at the necessary and minimal level for data processing in order to reduce unnecessary power consumption. On the other hand, when high-speed processing is required, the clock frequency is raised to meet processing performance. A series of operations are dynamically executed on the LSI, thereby performing required process and reducing the total power consumption.

A resonant frequency is determined depending on power line inductance L and power decoupling capacitance C in the LSI. This technique is disclosed in Japanese Laid-open Patent Publication No. H11-7330.

SUMMARY

According to one aspect of an embodiment, a semiconductor integrated circuit is provides. The semiconductor intergrated circuit comprises: a circuit that executes a predetermined process and a switching circuit that selects a power impedance. The switching circuit selects the power impedance, in accordance with a variation in voltage supplied to the circuit, so that a resonant frequency of the semiconductor integrated circuit is different from a operation frequency of the circuit.

BRIEF DESCRIPTION OF THE DRAWINGS

FIGS. 5A and 5B are diagrams for illustrating a method for determining the operation mode on the basis of the change in internal voltage;

FIGS. 6A and 6I are diagrams showing a timing example of determining a high-speed mode and switching the resonant frequency;

FIGS. 10A and 10B are diagrams showing an example of a circuit structure of a variable capacitance using an MOS transistor;

FIGS. 11A, 11B and 11C are diagrams showing an example of a circuit structure of a variable capacitance using an MEMS;

FIGS. 12A and 1213 arc diagrams showing an example of a circuit structure of a variable capacitance using a varactor capacitance;

FIG. 16 is a table showing a correspondence between the internal voltage state and the switching control;

DESCRIPTION OF THE PREFERRED EMBODIMENTS

Figure 1:
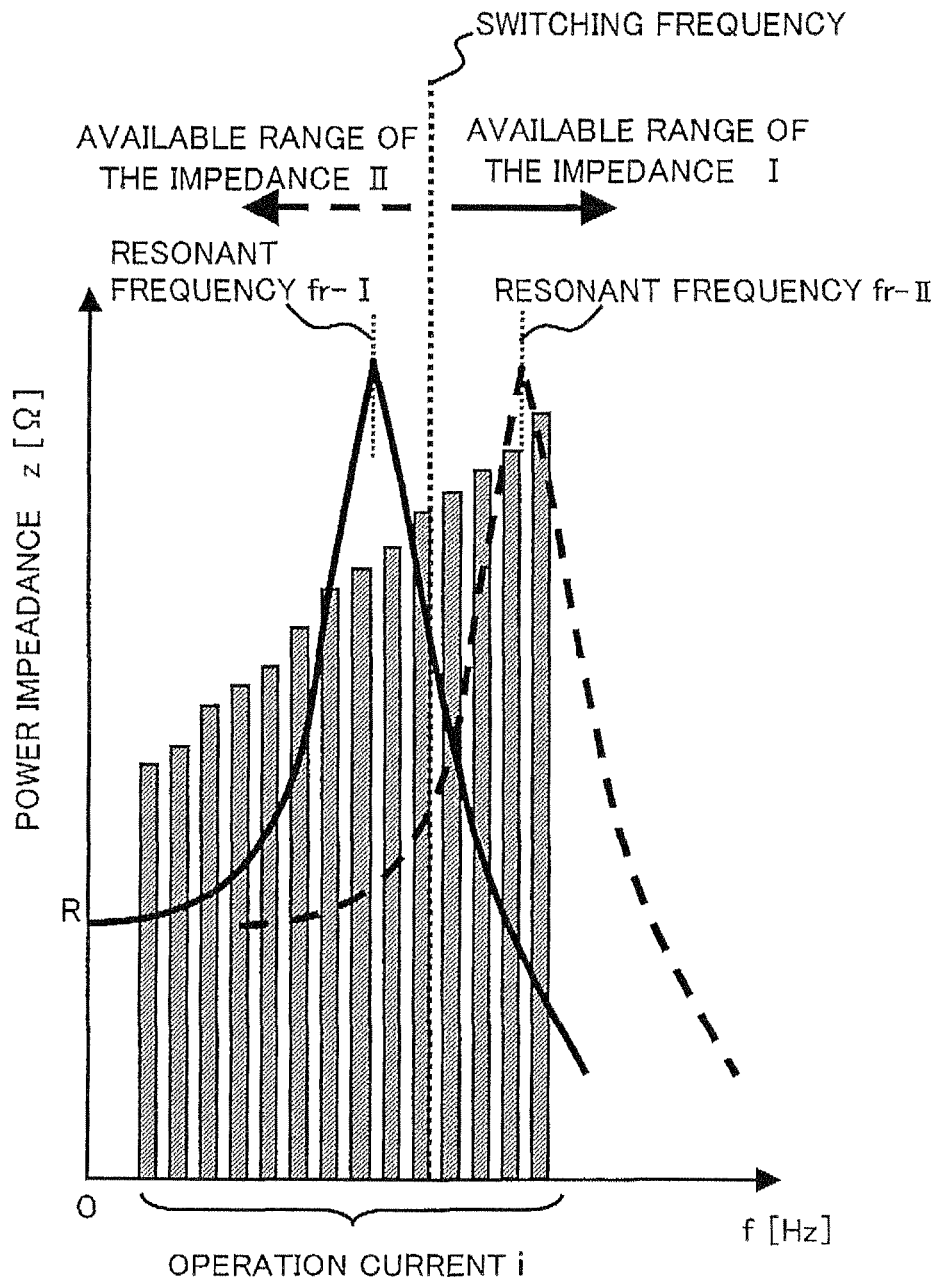
FIG. 1 is a graph for illustrating a method for controlling power impedance.

When the resonant frequency matches a spectrum of the operation current, the change in voltage caused by resonating power of the LSI amplifies the power noise. The power line inductance L or the decoupling capacitance C is adjusted at the design phase in order lo prevent the matching between the spectrum distribution of the operation current and the resonant frequency. It cannot be prevented on the LSI whose operation frequency is dynamically changed, thereby there is an operation frequency zone that cannot be used on the LSI. FIG. 1, shows a relationship between a frequency and power impedance with of operation current i. The power impedance is controlled in accordance with the operation frequency by using a variable inductance-capacitance-resistance (LCR). The resonant frequency that causes the power noise is changed. When the operation frequency is high, the variable LCR is controlled so as to generate the resonant frequency at a low frequency band (e.g., a resonant frequency fr-I), thereby operating the LSI at impedance (I). On the other hand, when the operation frequency is low, the variable LCR is controlled so as to generate the resonant frequency at a high resonant frequency band (e.g., a resonant frequency fr-II), thereby operating the LSI at impedance (II).

As a consequence, power impedance determined by the LCR parasitic on the LSI is changed to suppress the power noise caused in the LSI.

Figure 2B:
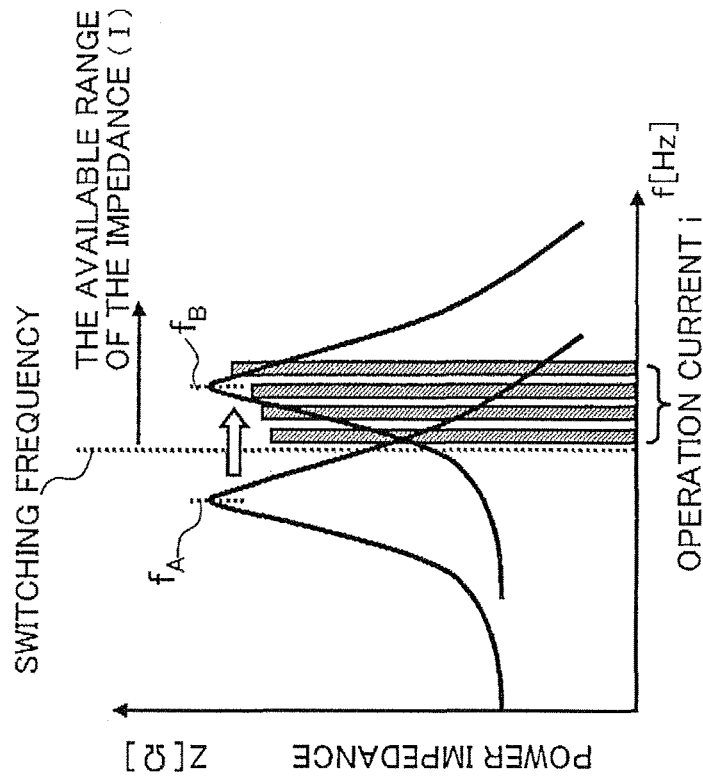
FIGS. 2A and 2B are diagrams for illustrating the different cases of a resonant frequency depending on an operation environment.
Figure 2A:
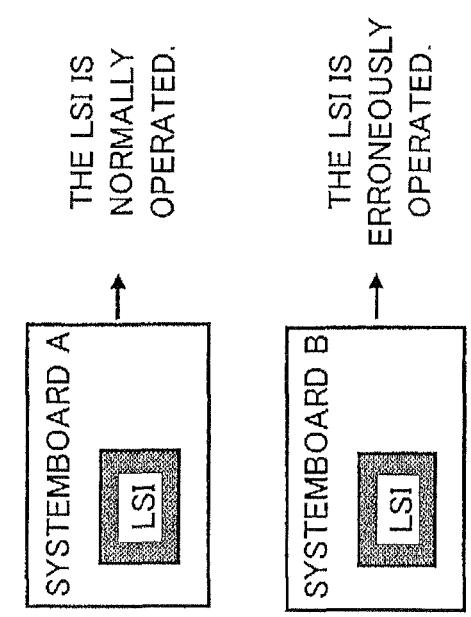

A frequency (hereinafter, referred to as a switching frequency) as the basis for switching to the resonant frequency fr-I or resonant frequency fr-II is predetermined in FIG. 1, and the variable LCR is controlled in accordance with the operation frequency, However, as shown in FIGS. 2A and 2B, when the LSI is mounted on a system board, the resonant frequency of the power can vary depending on the operation environment. Referring to FIG. 2A, in the case of mounting the same LSI on a system board A and a system board B, although the LSI is normally operated under the operation environment of the system board A, the LSI is erroneously operated on the system hoard B under the operation environment.

Referring to FIG. 2B, at the high operation frequency, with the LSI mounted on the system board A under the control to the impedance (I), the resonant frequency is changed to a low resonant frequency $f_A$ so as to normally operate the LSI. With the LSI, which is the same as that on the system hoard A, mounted on the system board B, a high resonant frequency $f_B$ is occurred under the operation environment which is different from that of the system board A stem board B and thereby the LSI mounted on the system board B operates abnormally.

Figure 3A:
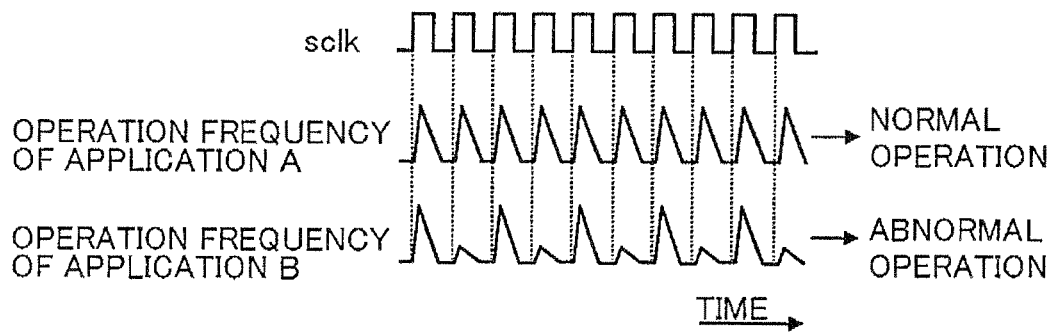
FIGS. 3A and 3B are diagrams for illustrating the case of the resonant frequency depending on the difference between two applications.
Figure 3B:
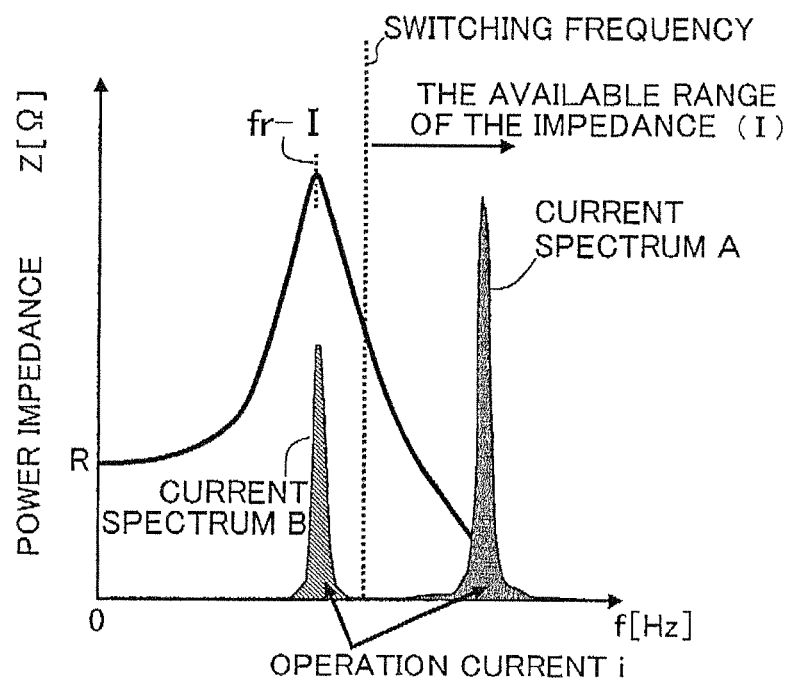

Even if the operation environments, the LSIs and the operation frequencies are equal, an application A is normally operated and an application B is abnormally operated, as shown in FIGS. 3A and 3B. The application A is different from the application B (e.g., application for MPEG-2 decoding and audio play).

FIG. 3A shows an operation frequency A of the application A and an operation frequency B of the application B. Both the application A and the application B are operated synchronously with a system clock sclk, for example. Although the operation frequency A is the same as the operation frequency B, the current spectrum distributions between the operated application A and B are changed and both the application A and B can be not operated at the resonant point therebetween.

Referring to FIG. 3B, the variable LCR is controlled so as to obtain impedance (I) for the operation frequencies A and B at operation current i. In this case, a current spectrum A upon operating the application A is generated within an available range of the impedance (I), thereby normally operating the application A. On the other hand, a current spectrum B upon operating the application B is generated out of the available range of the impedance (I), and the application B can be abnormally operated at the resonant point of the resonant frequency fr-I.

Even with the same operation frequency, since a current waveform in the LSI varies depending on contents of data processing, the operation frequency thus reaches the resonant frequency. Therefore, the LSI may not be optimally operated by simply controlling the variable LCR in accordance with the operation frequency so as to switch the resonant frequency.

Figure 4A:
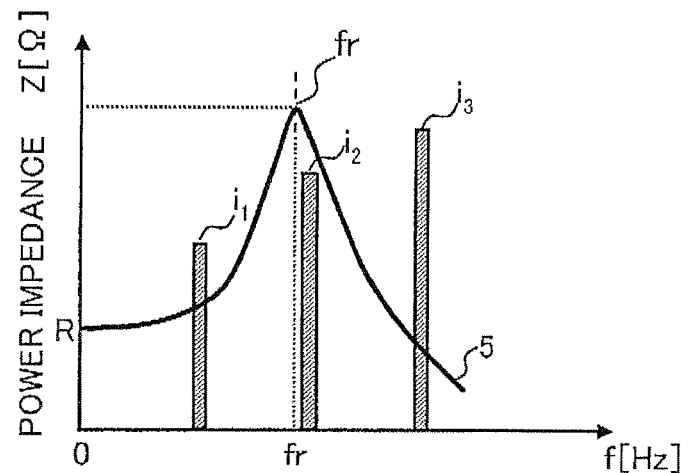
FIGS. 4A to 4D are diagrams for illustrating a relationship between an operation mode and a resonant frequency in the LSI.

FIGS. 4A to 4D shows a relationship between an operation mode and a resonant frequency in an LSI. FIG. 4A shows an example of impedance characteristics 5 of the LSI and levels of operation current $i_1$, $i_2$, and $i_3$ for every operation frequency in the LSI. The operation current $i_1$ is shown as an example of a low-speed operation mode as an operation mode, the operation current $i_2$ is shown as an example of a resonant mode in which a resonant frequency fr is generated, and the operation current $i_3$ is shown as an example of a high-speed operation mode.

Figure 4B:
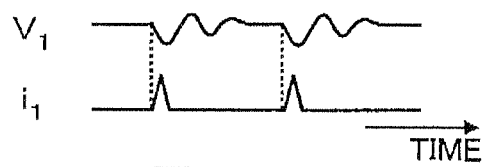

FIG. 4B shows a time-varying state of changing an operation voltage $v_1$ and the operation current $i_1$ in the LSI in the low-speed mode. Referring to FIG. 4B, AC noise converges during the circuit operation in the low-speed mode (within a cycle of the operation frequency).

Figure 4C:
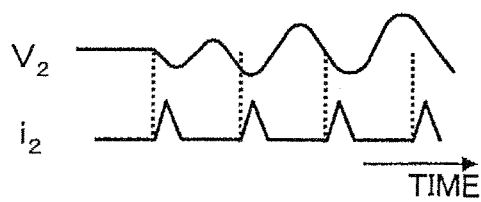

FIG. 4C shows a state of changing an operation voltage $v_2$ and the operation current $i_2$ in the LSI in the resonant mode. Referring to FIG. 4C, the AC noise is superimposed and amplified in the resonant mode.

Figure 4D:
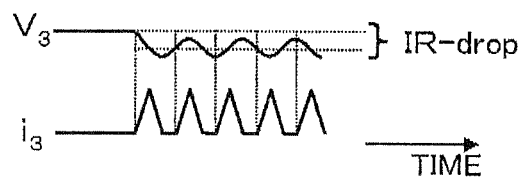

FIG. 4D shows a state of changing an operation voltage $v_3$ and the operation current $i_3$ in the LSI in the high-speed mode. Referring to FIG. 4D, since the operation current $i_3$ is high, IR drop occurs, and the AC noise is not however amplified in the high-speed mode.

As will be obviously understood, the operation voltages $v_1$ to $v_3$ respectively represent the changing states in accordance with the operation modes. Attention is paid to the change in internal voltage in the LSI, the operation mode is specified by detecting the change in internal voltage, and the operation frequency is controlled to switch a capacitance or resistance in the LSI so as to prevent the matching between the resonant frequency fr and the operation frequency. Therefore, a frequency as the base is not used.

A specific description will be given of the correspondence between the change in internal voltage and operation modes in the LSI with reference to FIGS. 5A and 5B. FIGS. 5A and 5B are diagrams for illustrating a method for determining the operation mode on the basis of the change in internal voltage. Referring to FIGS. 5A and 5B, an upper reference voltage and a lower reference voltage represent a target voltage for operating the LSI, and a low voltage, the target voltage, and a high voltage individually represent internal voltages.

At a voltage waveform 5a shown in FIG. 5A, at an undershoot detecting point 51, undershoots at which the internal voltage of the LSI is lower than the lower reference voltage are continuously detected. Therefore, it is determined that Dynamic IR-Drop (D-IRD) occurs and the operation in the high-speed mode is thus recognized.

If it is determined that the operation mode is the high-speed one, the control operation is performed so as to increase the capacitance or reduce the resistance.

At a voltage waveform 5b shown in FIG. 5B, the internal voltage of the LSI alternately repeats an undershoot lower than the lower reference voltage and an overshoot higher than the upper reference voltage. When a first undershoot is detected at an undershoot detecting point 52a, an overshoot is further detected at an overshoot detecting point 52b just after detecting the undershoot, and an undershoot is furthermore detected at an undershoot detecting point 52c just after the overshoot, the resonant mode for amplifying the change in internal voltage is determined on the basis of the resonant frequency fr.

If the operation mode is determined as the resonant mode, the control operation is performed so as to reduce the capacitance or increase the resistance.

FIG. 5B shows an example of a voltage waveform 5b in which an undershoot is first detected. Even if a waveform in which the overshoot is first detected is one with the inverse phase, the operation mode is similarly determined as the resonant mode.

A description will be given of a switching timing of the resonant frequency fr in accordance with the determintion of the operation mode with reference to FIGS. 6A to 7B. Referring to FIGS. 6A to 7B, the state of the internal voltage is shown by the passage of time t.

FIGS. 6A and 6B are diagrams showing examples of the timing for switching the resonant frequency fr as a result of determination as the high-speed mode. In the case of the D-IRD having the change only between the target voltage and the low voltage as shown in FIG. 6A, the number of changing times from the target voltage to the low voltage is counted, and the resonant frequency fr is switched by controlling the capacitance or resistance when the number of changing times is a predetermined number of changing times.

For example, when the change from the target voltage to the low voltage enables the number of changing times to reach "2", the resonant frequency fr is switched. At the time when the first change from the target voltage to the low voltage enables the number of changing times to "1", a resonant mode shown in FIG. 7A, which will be described later, is not identified from the operation mode, the D-IRD is determined by the change to the low voltage from the target voltage at which the number of changing times is "2".

In the case of the D-IRD in which the target voltage is changed to the low voltage as shown in FIG. 6B and the low voltage state thereafter continues, the capacitance or resistance is controlled after the passage of predetermined time T from the changing time from the target voltage to the low voltage so as to switch the resonant frequency fr. For example, a predetermined time T is set to be longer than the changing time to the low voltage state in the change in internal voltage in which the operation frequency is superimposed to the resonant frequency fr.

Referring to FIGS. 6A and 6B, upon switching the resonant frequency fr by controlling the capacitance, the capacitance is changed to the high level from the low level. When the capacitance is already large, the current operation frequency keeps. Upon switching the resonant frequency fr by controlling the resistance, the resistance is changed from the high level to the low level. When the resistance is already low, the current operation frequency keeps.

Figure 7A:
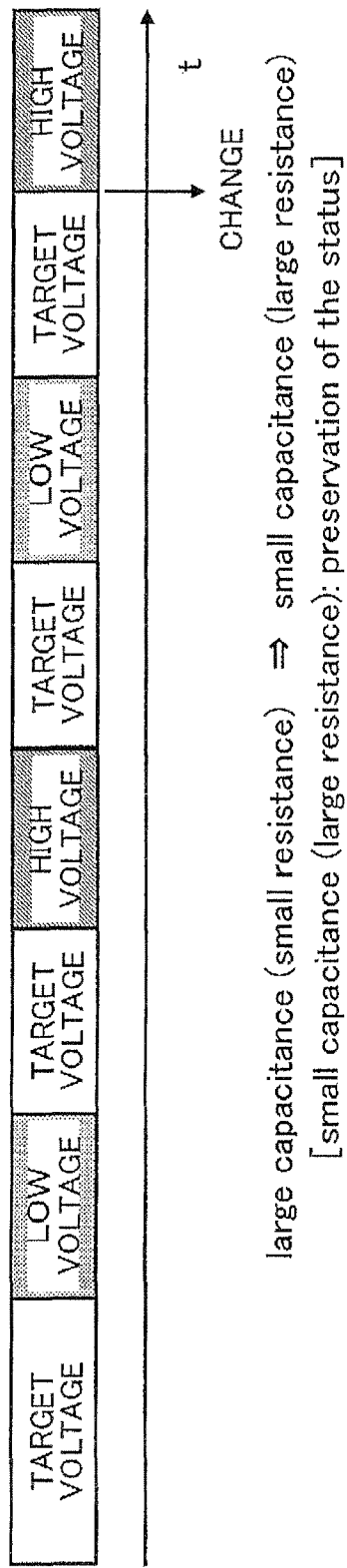
FIGS. 7A and 7B are diagrams showing a timing example of determining a resonant mode and switching the resonant frequency.
Figure 7B:
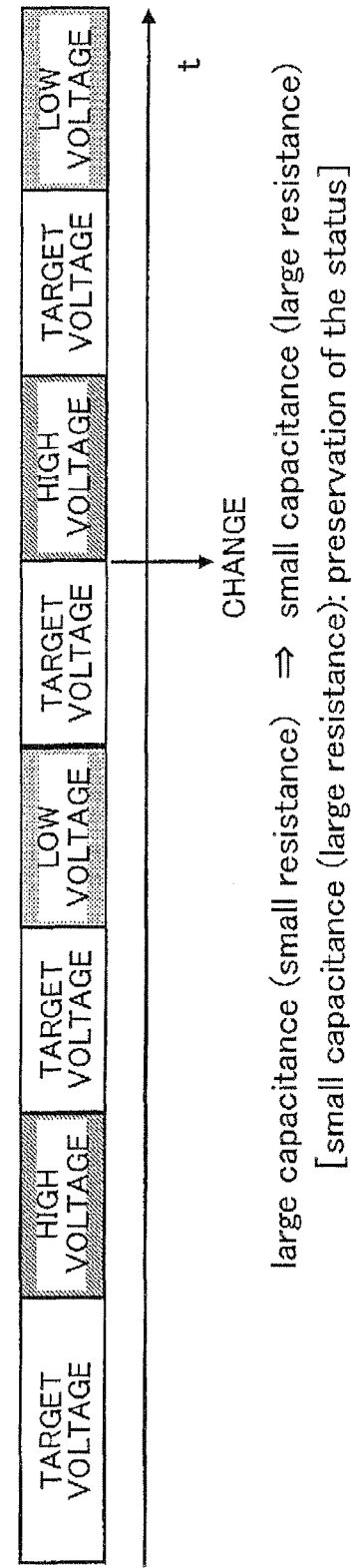

FIGS. 7A and 7B are diagrams showing examples of timing for switching the resonant frequency fr as a result of determination as the resonant mode. At the timing for switching the resonant frequency fr, the number of changing times from the target voltage to the high voltage is counted and the number of changing times is a predetermined number of changing times, the operation mode is determined as the resonant mode and the resonant frequency fr is switched by controlling the capacitance or resistance.

In the resonant mode that starts due to the change in low voltage as shown in FIG. 7A, the resonant frequency fr is switched at the second changing time to the high-voltage.

In the resonant mode that starts at the changing time to the high voltage shown in FIG. 7B, the resonant frequency fr is similarly switched at the second changing time to the high voltage.

Referring to FIGS. 6A and 6B, upon switching the resonant frequency fr, the predetermined time T shown in FIG. 6B is reset. Further, in order to determine that the operation state is not the D-IRD state at least at the changing time from the target voltage to the high voltage, the predetermined time T shown in FIG. 6B may be reset at this time.

Referring to FIGS. 7A and 7B, upon switching the resonant frequency fr by controlling the capacitance, the capacitance is changed from the high level to the low level. When the capacitance is already at the low level, the current capacitance keeps. Upon switching the resonant frequency fr by controlling the resistance, the resistance is changed from the low level to the high level. When the resistance is already high, the current resistance keeps.

Also in the resonant mode that starts at the changing time to the high voltage, the similar control operation is performed.

Figure 8:
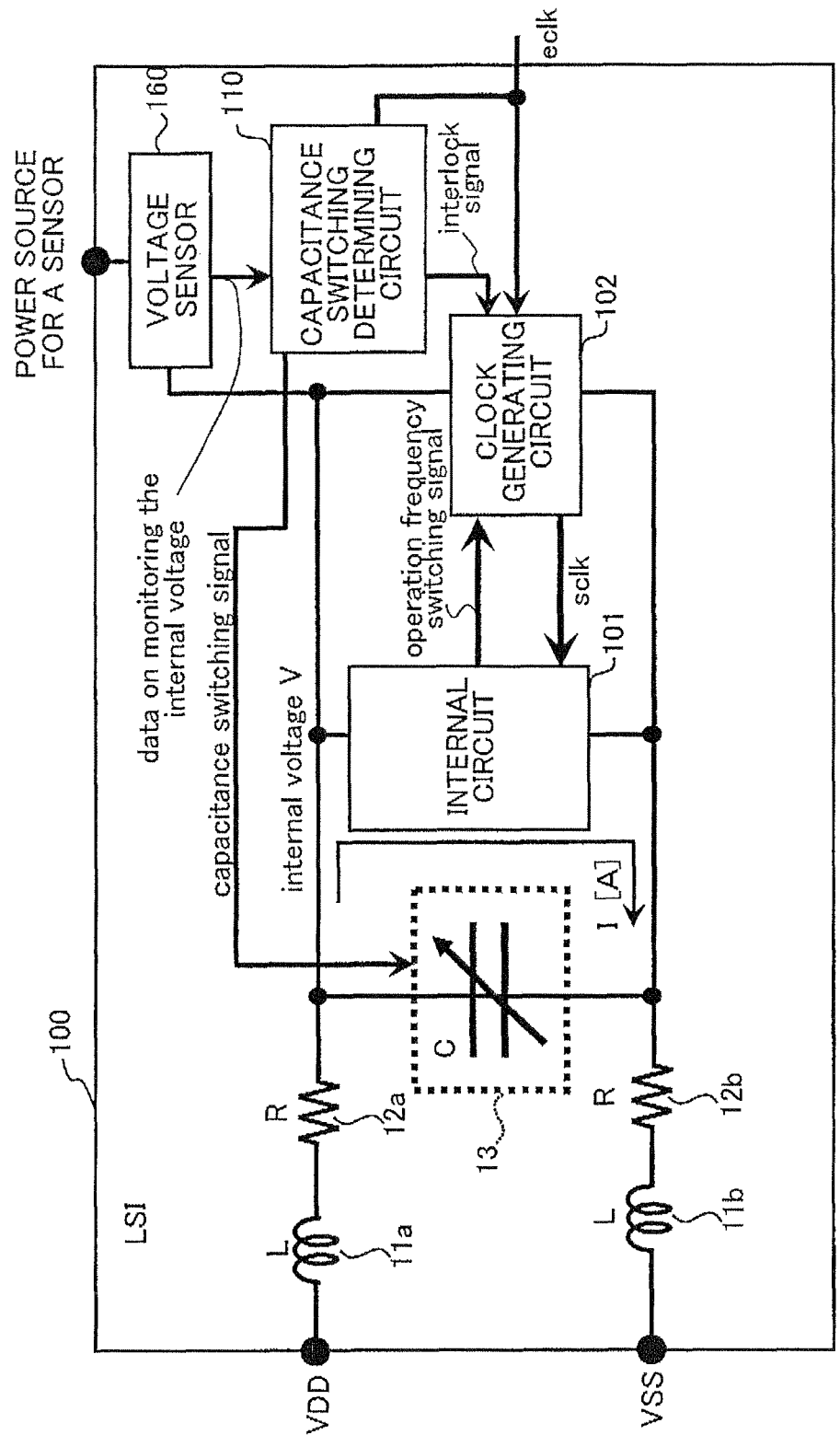
FIG. 8 is a diagram showing an example of a first circuit structure of an LSI for controlling capacitance in accordance with the change in internal voltage.

Hereinafter, a specific description will be given of a system for switching the resonant frequency fr in accordance with the change in internal voltage. First of all, a description will be given of a system for controlling the capacitance in accordance with the change in internal voltage. FIG. 8 is a diagram showing an example of a first circuit structure of the LSI for controlling the capacitance in accordance with the change in internal voltage. Referring to FIG. 8, an LSI 100 comprises: inductors 11a and 11b; resistances 12a and 12b; an internal circuit 101 that performs predetermined processing; a clock generating circuit 102; a capacitance switching determining circuit 110; and a voltage sensor 160. Incidentally, the embodiments are not limited to the voltage sensor 160, and may use a sensor that detects the change in internal voltage.

A source voltage VDD and a ground voltage VSS are applied via the inductor 11a and resistance 12a and the inductor 11b and resistance 12b, and an internal voltage v is applied to the internal circuit 101. Further, the internal circuit 101 is operated, thereby flowing power current I(A) and changing the power voltage in the LSI 100. A variable capacitance 13 suppresses the change in voltage thereof and the capacitance is switched, thereby dynamically changing the resonant point that causes the power noise.

In the internal circuit 101, an operation frequency switching signal indicating that a request for switching the operation frequency is sent to the clock generating circuit 102 in accordance with the using situation. The internal circuit 101 is operated synchronously with a system clock sclk in response to the request for switching the operation frequency sent from the clock generating circuit 102. The internal circuit 101 designates the operation frequency in accordance with the using situation, thereby adjusting the power consumption.

The clock generating circuit 102 inputs an external clock eclk, and supplies the system clock sclk to the internal circuit 101 with the operation frequency selected in accordance with the switching signal from the internal circuit 101. Further, the clock generating circuit 102 stops the system clock sclk having the operation frequency in response to an interlock signal sent from the capacitance switching determining circuit 110, and sets the internal circuit 101 to the target voltage for predetermined time. Thereafter, the output of the system clock sclk restarts.

The capacitance switching determining circuit 110 analyzes the change in internal voltage of the internal circuit 101. If the high-speed mode or the resonant mode is determined, a capacitance switching signal for dynamically switching the capacitance is sent to the variable capacitance 13. Further, if the internal voltage is an ultra-high one or ultra-low voltage, it is determined that the internal circuit 101 is in a dangerous state. Then, in order to intermittently stop the system clock clk for operating the internal circuit 101, the interlock signal is sent to the clock generating circuit 102.

The voltage sensor 160 measures the internal voltage v, and sends the measurement result to the determining circuit 110. The internal voltage v and the power for sensor are sent, and the voltage sensor 160 sends, to the capacitance switching determining circuit 110, data on monitoring the internal voltage indicating a result of detecting the actual change in internal voltage v.

Figures 9A, 9B:
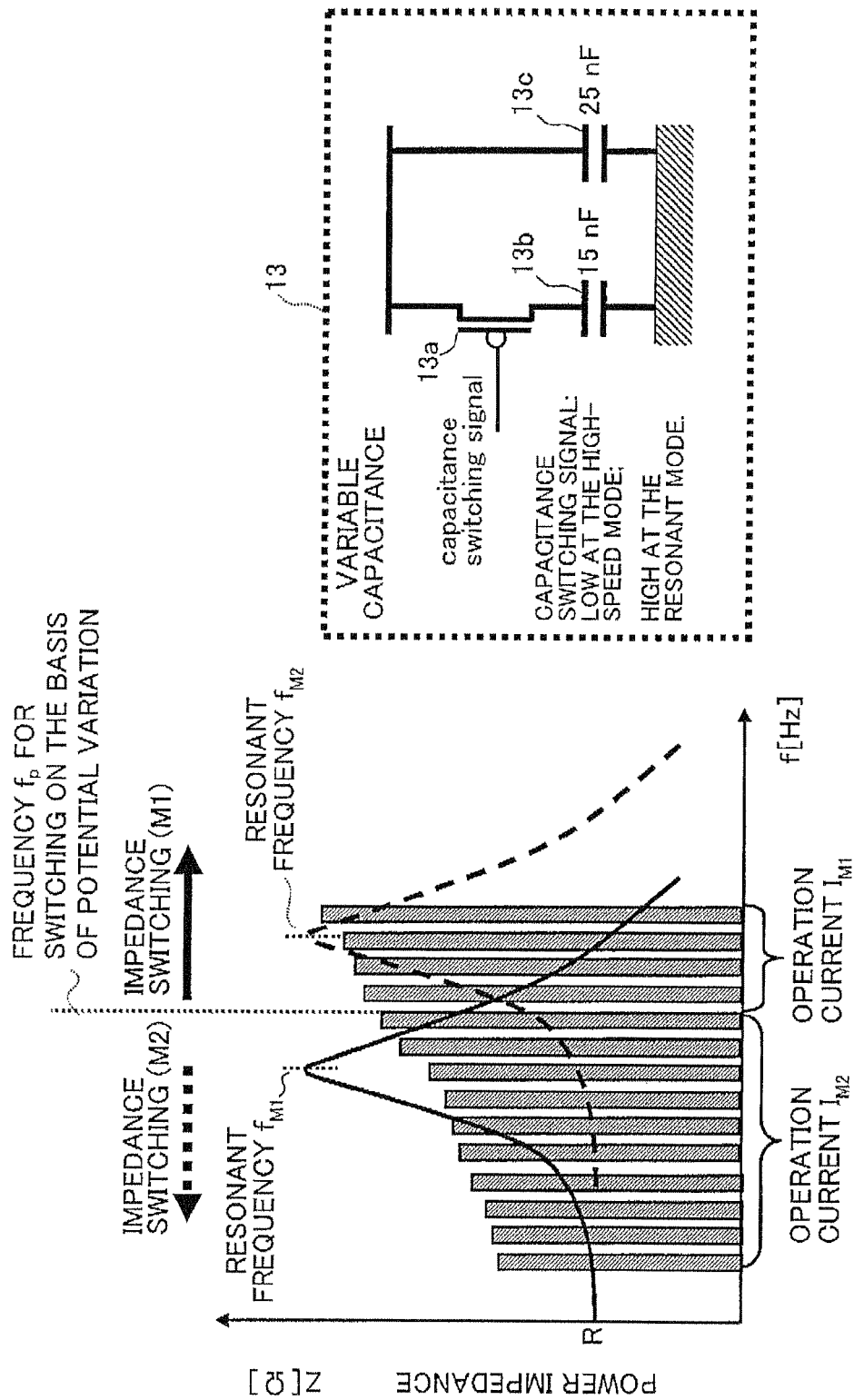
FIGS. 9A and 9B are diagrams showing switching control of the capacitance and a structure example of a variable capacitance.

The switching control of the capacitance will be described with reference to FIGS. 9A and 9B. FIG. 9A is a graph showing a relationship between the operation current and the resonant frequency as a switching result of the capacitance based on the change in voltage. FIG. 9B is a diagram showing all example of a circuit structure of the variable capacitance 13 shown in FIG. 8.

Referring to FIG. 9A, the capacitance switching determining circuit 110 detects (MI) the high-speed mode on the basis of the change in internal voltage, and then controls the variable capacitance 13 to impedance switching (MI) for high-speed mode so that the internal circuit 101 performs the operation at the high frequency due to operation current $i_{M1}$ without fail.

Referring to FIG. 9B, the variable capacitance 13 comprises: a switch 13a that is ON/OFF in response to the capacitance switching signal; a first capacitance 13b; and a second capacitance 13c. The first capacitance 13b and the second capacitance 13c are connected in parallel therewith. When the high-speed mode is detected (MI), the capacitance switching signal switches the switch 13a to ON with the maximal capacitance. On the other hand, when the resonant mode is detected (M2) on the basis of the change in internal voltage, the capacitance switching signal switches the switch 13a to OFF with the minimal capacitance.

The maximal capacitance means a capacitance for keeping the target voltage also at the operation time with the maximal frequency in the high-speed mode. For example, when the maximal frequency is 400 MHz, a capacitance of 40 nF is used. The second capacitance 13c means the minimal capacitance for keeping the target voltage also at the operation time with the minimal frequency in the low-speed mode. For example, when the minimal frequency is 50 MHz, a capacitance of 25 nF is used. Therefore, the first capacitance 13b is applied by switching the switch 13a to ON. Further, the first capacitance 13b is added to the second capacitance 13c to realize the maximal capacitance, e.g., a capacitance of 15 nF is used.

Therefore, in the impedance switching (MI) in FIG. 9A, the switch 13a is ON with the variable capacitance 13 and the capacitance is controlled so as to reach the maximal capacitance.

Referring to FIG. 9A, when the capacitance switching determining circuit 110 detects the resonant mode on the basis of the change in internal voltage, the variable capacitance 13 is controlled so as to set the impedance switching (M2) for the resonant mode, and the internal circuit 101 is set to perform the operation at the low frequency with operation current $i_{M2}$ without fail. The impedance switching (M2) corresponds to the resonant mode and the low-speed mode.

In this case, referring to FIG. 9B, the capacitance switching signal switches switch 13a to OFF, and the variable capacitance 13 is the minimal capacitance.

A description will be given of another example of the circuit structure of the variable capacitance 13 with reference to FIGS. 10A to 12B. FIGS. 10A and 10B are diagrams showing examples of the circuit structure of the variable capacitance 13 using an MOS transistor. Referring to FIG. 10A, a variable capacitance 131 comprises: an MOS (Metal Oxide Semiconductor) transistor 131a; and a back bias 131b.

The back bias 131b changes a back bias voltage VBB, thereby controlling a threshold voltage Vth of the MOS transistor 131a so as to switch a capacitance value.

Referring to FIG. 10B showing a relation between a voltage Vgs and a capacitance value C of the MOS transistor 131a, upon detecting (M1) the high-speed mode at the internal voltage v of the LSI 100, the back bias voltage VBB is controlled to 0V, the threshold voltage Vth of the MOS transistor 131a is reduced, the capacitance value C of the MOS transistor 131a is a high capacitance $C_{M1}$. On the other hand, upon detecting (M2) the resonant mode, the bias voltage VBB is controlled to −1.5V, the threshold voltage Vth of the MOS transistor 131a is increased, and the capacitance value C of the MOS transistor 131a is a low capacitance $C_{M2}$.

FIGS. 11A to 11C are diagrams showing an example of a circuit structure of the variable capacitance 13 using an micro electro mechanical system (MEMS). Referring to FIG. 11A, a variable capacitance 132 comprises: an MEMS 132a that is switched ON/OFF by the capacitance switching signal; a first capacitance 132b; and a second capacitance 132c. The variable capacitance 132 is an example of the circuit structure using the MEMS 132a for reducing a switch resistance. The first capacitance 132b and the second capacitance 132c are connected in parallel therewith. The first capacitance 132b and the second capacitance 132c are similar to the first capacitance 13b and the second capacitance 13c shown in FIG. 9B, and a description is therefore omitted.

A brief description will be given of the operation of the MEMS 132a with reference to FIGS. 11B and 11C. Upon detecting (M1) the high-speed mode, the MEMS 132a enters the ON mode by applying a voltage of (−1.5V) in response to the capacitance switching signal, as shown in FIG. 11B. Further, upon detecting (M2) the resonant mode, the MEMS 132a enters the OFF mode by applying a voltage of (+1.2V) in response to the capacitance switching signal, as shown in FIG. 11C.

Figure 12B:
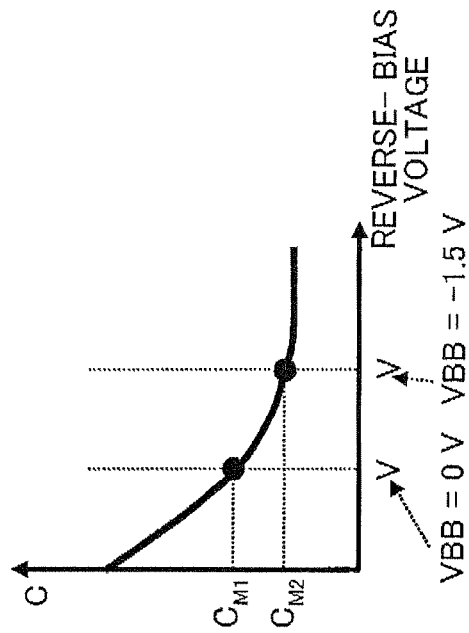
Figure 12A:
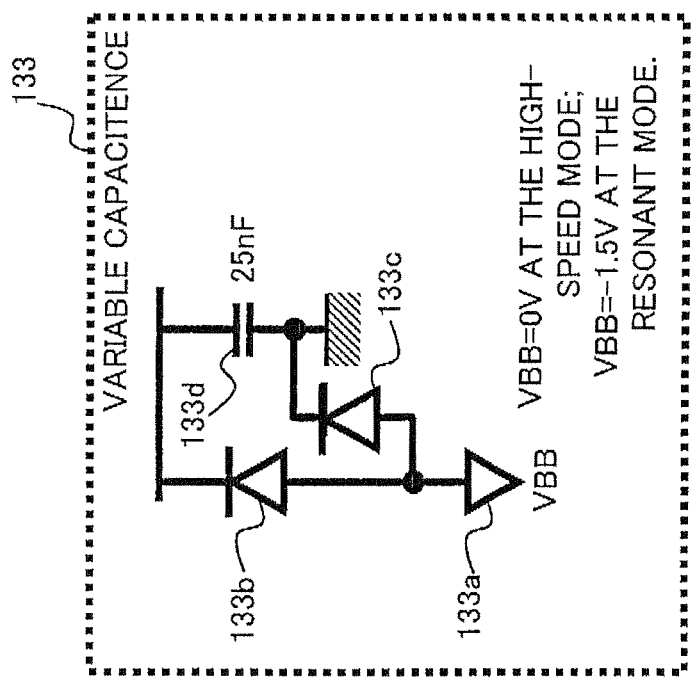

FIGS. 12A and 12B are diagrams showing examples of a circuit structure of the variable capacitance 13 using a varactor capacitance. Referring to FIG. 12A, a variable capacitance 133 comprises: a back bias 133a; a varactor capacitance 133b; a varactor capacitance 133c; and a capacitance 133d. The variable capacitance 13 has a circuit structure in which the back bias 133a applies an inverse-bias voltage to a diode, and the variable capacitance 133 includes the varactor capacitance 133b and the varactor capacitance 133c.

Referring to FIG. 12B showing a relation between the capacitance value and the inverse-bias voltage of the variable capacitance 133, at an internal voltage v of the LSI 100, upon detecting (M1) the high-speed mode, the back bias voltage VBB is controlled to 0V, and a capacitance value C of the variable capacitance 133 is a high capacitance $C_{M1}$. On the other hand, upon detecting (M2) the resonant mode, a back-bias voltage VBB is controlled to −1.5V, and the capacitance value C of the variable capacitance 133 is a low capacitance $C_{M2}$.

The circuit structure facilitates the high capacitance $C_{M1}$ and the low capacitance $C_{M2}$ to have the difference therebetween, thereby giving the degree of freedom in design.

A description will be given later of the circuit structures of the clock generating circuit 102, the capacitance switching determining circuit 110, and the voltage sensor 160 shown in FIG. 8.

Figure 13:
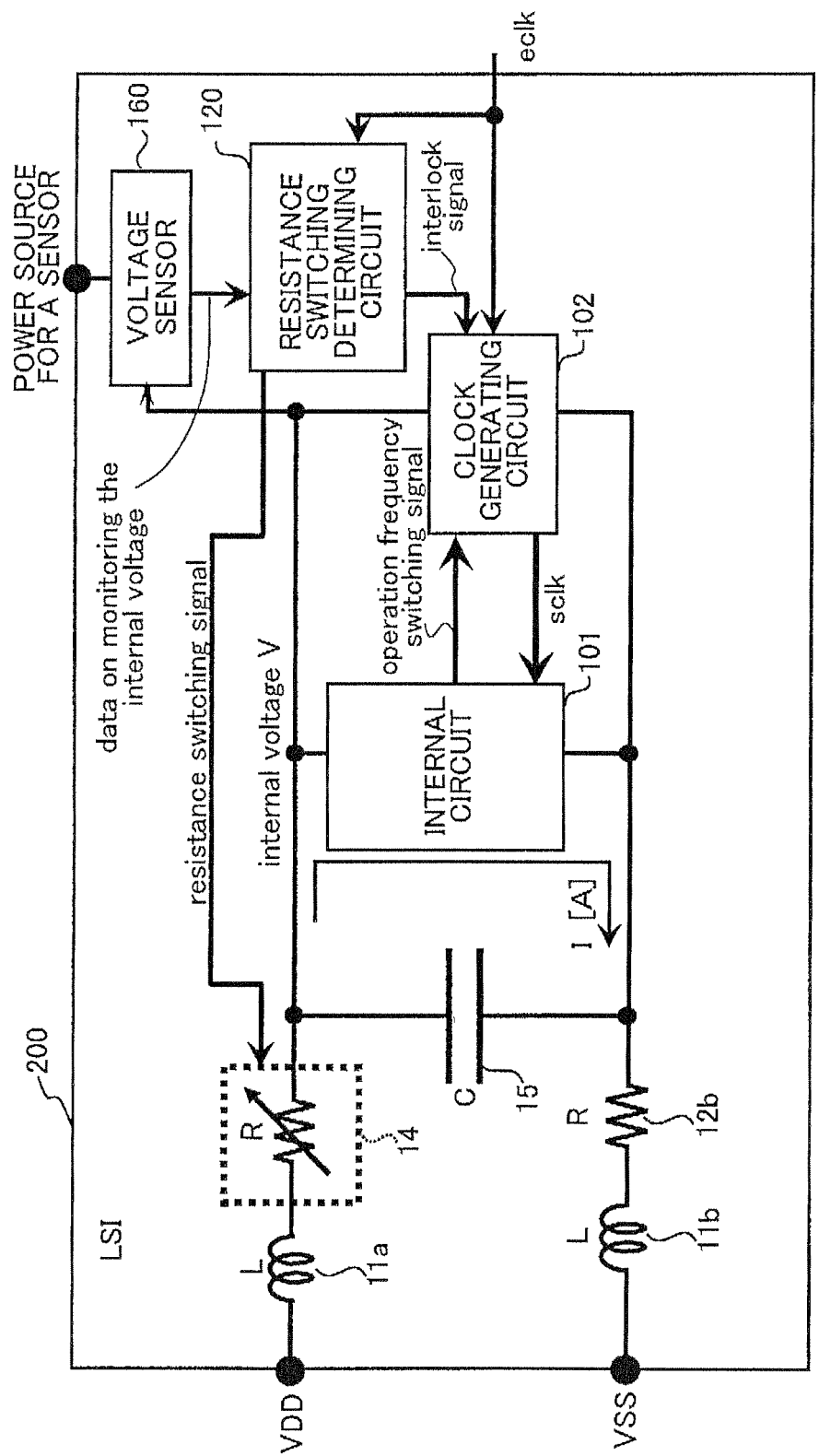
FIG. 13 is a diagram showing an example of a second circuit structure of an LSI for controlling resistance in accordance with change in internal voltage.

Next, a description will be given of a system for controlling a resistance in accordance with the change in internal voltage. FIG. 13 is a diagram showing a structure example of a second circuit of the LSI for controlling the resistance in accordance with the change in internal voltage. Referring to FIG. 13, an LSI 200 comprises: inductors 11a and 11b; a resistance 12b; a variable resistance 14; an internal circuit 101 for performing predetermined processing; a clock generating circuit 102; a resistance switching determining circuit 120; and a voltage sensor 160. A description will be given of the similar operation of the first circuit structure of the internal circuit 101, the clock generating circuit 102, and the voltage sensor 160 shown in FIG. 8.

A source voltage VDD and a ground voltage VSS are applied via the inductor 11a, the variable resistance 14, the inductor 11b, and the resistance 12b, and an internal voltage v is applied to the internal circuit 101. Further, the internal circuit 101 is operated, thereby flowing power current I(A). As a consequence, the power voltage in the LSI 200 changes. A capacitance 15 suppresses the voltage change. The variable resistance 14 further switches the resistance, thereby dynamically changing the resonant point that causes the power noise.

With the second circuit structure, the clock generating circuit 102 receives an interlock signal from the resistance switching determining circuit 120, and stops the system clock sclk having the operation frequency.

The resistance switching determining circuit 120 analyzes the change in internal voltage of the internal circuit 101, and transmits a resistance switching signal for dynamically switching the resistance upon determining the high-speed mode or the resonant mode to the variable resistance 14. Further, when the internal voltage is an ultra-high one or ultra-low one, the internal circuit 101 is determined as a dangerous mode thereof In order to intermittently stop the system clock sclk for operating the internal circuit 101, the interlock signal is transmitted to the clock generating circuit 102.

The voltage sensor 160 supplies data on monitoring the internal voltage indicating the actual change in internal voltage v to the resistance switching determining circuit 120.

Figures 14A, 14B:
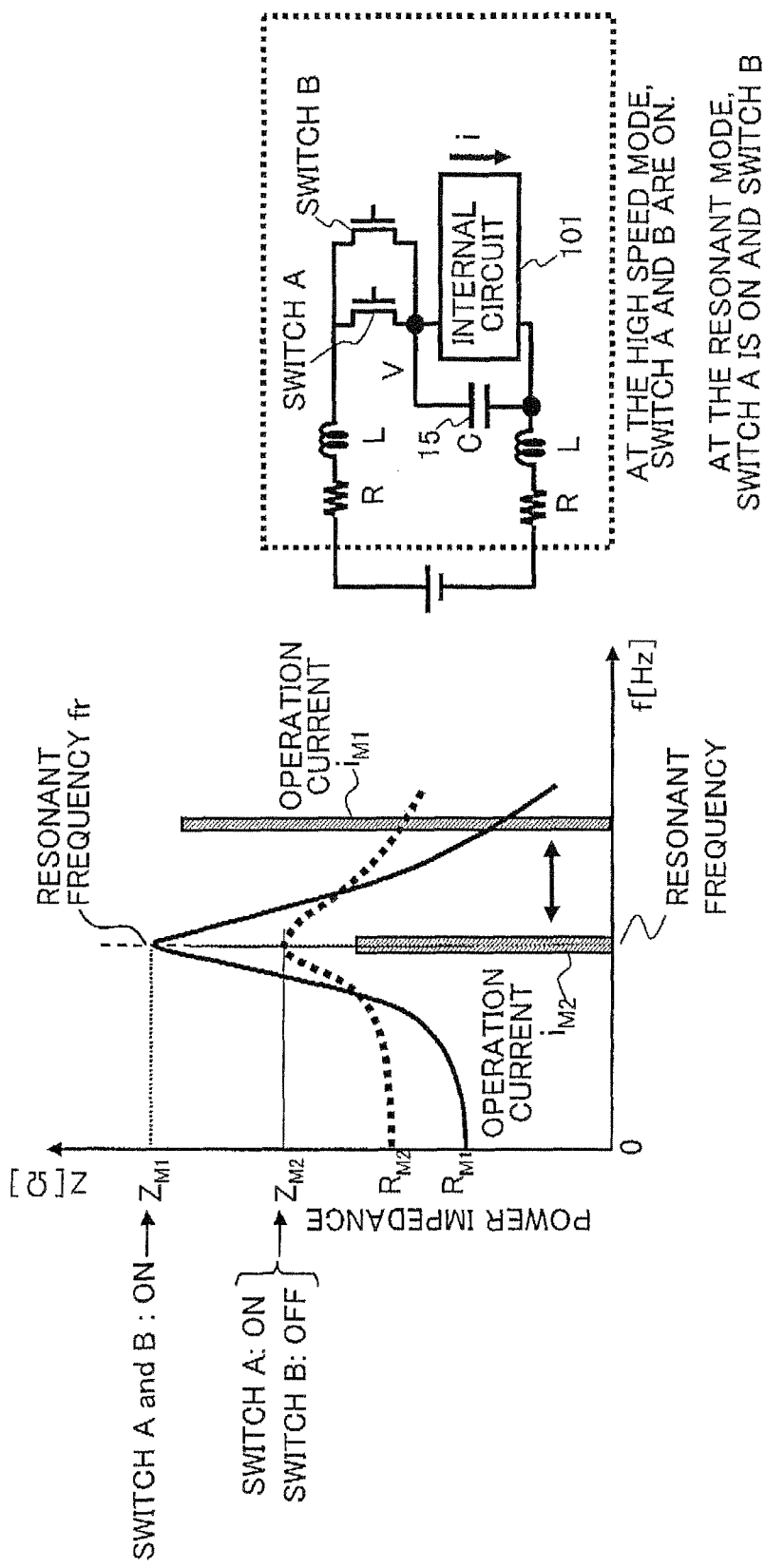
FIGS. 14A and 14B are diagrams showing switching control of resistance and a structure example of a variable resistance.

A description will be given of switching control of the resistance with reference to FIGS. 14A and 14B. FIG. 14A is a diagram showing a relation between the operation current and the resonant frequency as a result of switching the resistance on the basis of the change in voltage. FIG. 14B is a diagram showing an example of the circuit structure of the variable resistance 14 shown in FIG. 13.

Referring to FIG. 14A, the resistance switching determining circuit 120 detects (M1) the high-speed mode on the basis of the change in internal voltage, thereby controlling the variable resistance 14 to a resistance $R_{M1}$ for the high-speed mode. In this case, power impedance with the resonant frequency fr occurring the resonant point has a value $Z_{M1}$, i.e., high. Since the power impedance can be reduced with the operation current $i_{M1}$, the internal circuit 101 can perform the operation with a high frequency caused by the operation current $i_{M1}$.

On the other hand, the resistance switching determining circuit 120 detects (M2) the resonant mode on the basis of the change in internal voltage, thereby controlling the variable resistance 14 to a resistance $R_{M2}$ for the resonant mode, higher than the resistance $R_{M1}$ for the high-speed mode. In this case, since the power impedance with the resonant frequency fr at the resonant point has a value $Z_{M2}$ lower than the value $Z_{M1}$, the internal circuit 101 performs the operation with a low frequency caused by the operation current $i_{M2}$ while suppressing the power noise.

The resonant frequency fr, the power noise of the internal circuit 101, and an amplitude increasing coefficient at the resonant point are obtained by the following expressions.

Resonant frequency $fr=1/\{2\pi\sqrt{L \times C}\}$

Power noise $v(f)=i(f) \times z(f)$

Amplitude increasing coefficient $Q=\{1/R\} \times \{\sqrt{L/C}\}$

The variable resistance 14 is controlled by the resistance switching determining circuit 120 so as to suppress the power noise on the basis of the change in internal voltage. Referring to FIG. 14B, the variable resistance 14 has a switch A and a switch B that are switched ON/OFF by the resistance switching, and is structured between a power source and the internal circuit 101 or between the internal circuit 101 and the ground. The switch A and the switch B are connected in parallel therewith. By using resistances included in the switch A and the switch B, the variable resistance 14 is switched. Upon detecting (M1) the high-speed mode, the resistance switching signal enables the switch A and the switch B to be ON, and the variable resistance 14 is a low resistance (resistance $R_{M1}$ in FIG. 14A). On the other hand, upon detecting (M2) the resonant mode on the basis of the change in internal voltage, the resistance switching signal enables the switch B to be switched from ON to OFF. The variable resistance 14 is a high resistance (resistance $R_{M2}$ in FIG. 14A).

Figure 15:
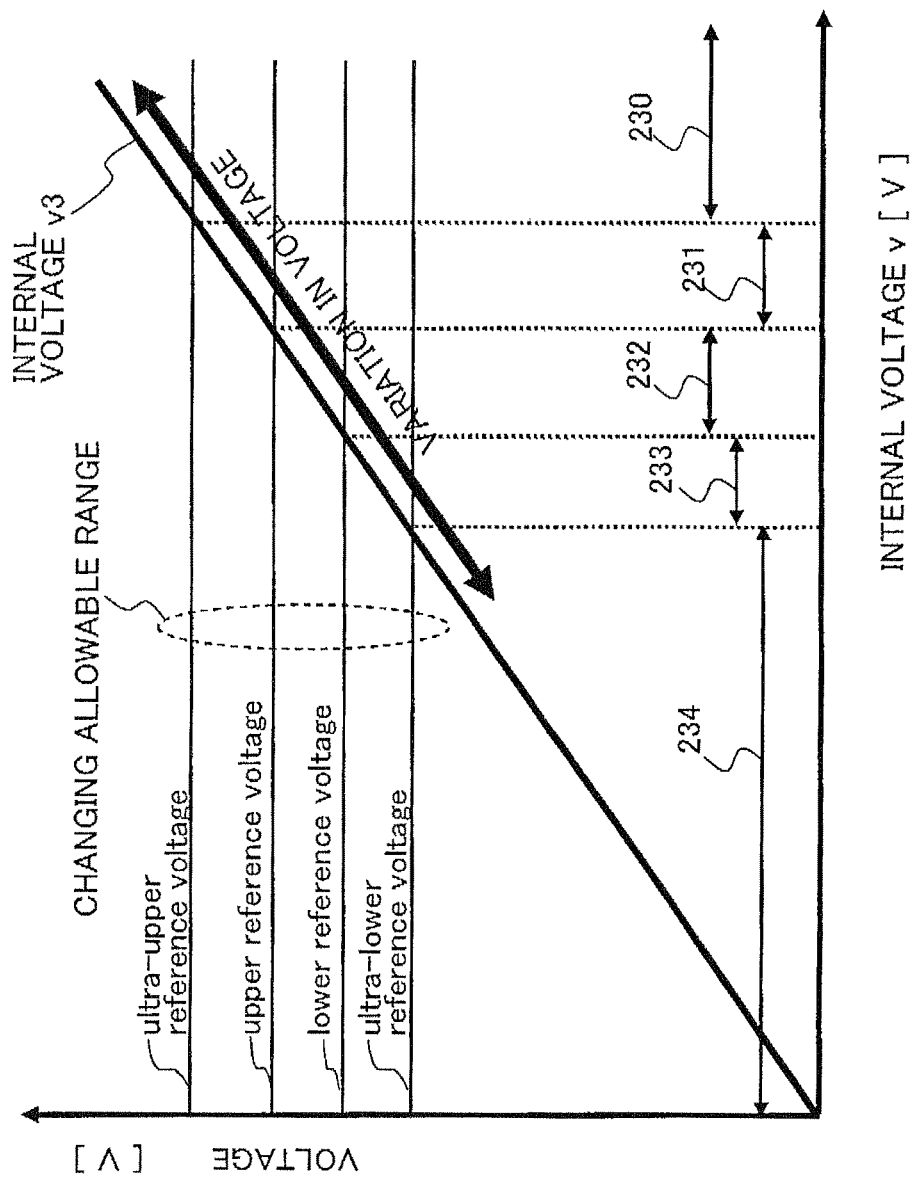
FIG. 15 is a graph for illustrating a state of an internal voltage detected by a voltage sensor.

A description will be given of the data on monitoring the internal voltage indicating the current internal voltage v of the internal circuit 101, supplied from the voltage sensor 160, with the first circuit structure of the LSI 100 shown in FIG. 8 and in the second circuit structure of the LSI 200 shown in FIG. 13 with reference to FIGS. 15 and 16. FIG. 15 is a graph for illustrating the state of the internal voltage detected by a voltage sensor 530.

In the graph shown in FIG. 15, the abscissa denotes the internal voltage v applied to the internal circuit 101, and the ordinate denotes the voltage detected by the voltage sensor 160.

The voltage sensor 160 has an ultra-upper reference voltage, an upper reference voltage, a lower reference voltage, and an ultra-lower reference voltage, and those voltages are shown on the ordinate. The internal circuit 101 is normally operated within a changing allowable range 7 of the internal voltage v.

An ultra-high voltage 230 is not-less-than the ultra-upper reference voltage, a high-voltage 231 ranges from the ultra-upper reference voltage to the upper reference voltage, a target voltage 232 ranges from the upper reference voltage to the lower reference voltage, a low voltage 233 ranges from the lower reference voltage to the ultra-lower reference voltage, and an ultra-low voltage 234 is not-more-than the ultra-lower reference voltage.

The power source is ON, and the internal voltage v applied to the internal circuit 101 then changes from the ultra-low voltage 234 to the target voltage 232 and also enters a stable and initial state. When the operation current i and the resonant frequency fr are superimposed in the operation state of the internal circuit 101, the internal voltage v greatly changes and moves from the target voltage 232 to the ultra-low voltage 234 or the ultra-high voltage 230. The state of the internal voltage caused by this change is shown by a straight line of an internal voltage v3.

The voltage sensor 160 supplies, to the capacitance switching determining circuit 110 in the first circuit structure of the LSI 100 shown in FIG. 8, the data on monitoring the internal voltage indicating the state of the internal voltage detected by the ultra-upper reference voltage, the upper reference voltage, the lower reference voltage, and the ultra-lower reference voltage. Further, the data on monitoring the internal voltage is supplied to the resistance switching determining circuit 120 in the second circuit structure of the LSI 200 shown in FIG. 13.

FIG. 16 is a table showing the correspondence between the state of the internal voltage and the switching control. Referring to FIG. 16, the data on monitoring the internal voltage has signals a, b, c, and d, indicating 0 or 1. In the switching control shown in FIG. 16, the capacitance switching determining circuit 110 in the first circuit structure of the LSI 100 shown in FIG. 8 switches or interlocks the variable capacitance 13 in accordance with the operation mode determined by using the data on monitoring the internal voltage. With the second circuit structure of the LSI 200 shown in FIG. 13, the resistance switching determining circuit 120 controls the operation for switching or interlocking the variable resistance 14 in accordance with the operation mode determined by using the data on monitoring the internal voltage. In the interlocking operation, it is controlled that the system clock sclk supplied to the internal circuit 101 intermittently stops.

When the voltage level of the internal voltage v3 shown in FIG. 16 is ultra-high, i.e., not less than the ultra-upper reference voltage, the data on monitoring the internal voltage indicates "1111" (all the signals a, b, c, and d indicate "1"). In this case, the supply of a system clock eclk to the internal circuit 101 is interlocked.

When the voltage level of the internal voltage v3 is the high voltage, i.e., the internal voltage v3 does not reach the ultra-upper reference voltage but is not less than the upper reference voltage, the data on monitoring the internal voltage indicates "0111" (the signal "a" indicates "0" and the signals b, c, and d indicate "1"). In this case, the switching of capacitance is executed, thereby setting the variable capacitance 13 to a low capacitance. Alternatively, the switching of resistance is executed, thereby setting the variable resistance 14 to a high resistance.

When the voltage level of the internal voltage v3 is the target voltage, i.e., the internal voltage v3 does not reach the upper reference voltage but is not less than the lower reference voltage, the data on monitoring the internal voltage indicates "0011" (the signals a and b indicate "0" and the signals c and d indicate "1"). In this case, the current state of the variable capacitance 13 or the variable resistance 14 keeps.

When the voltage level of the internal voltage v3 is the low voltage, i.e., the internal voltage v3 does not reach the lower reference voltage but is not less than the ultra-lower reference voltage, the data on monitoring the internal voltage indicates "0001" (the signals a, b, and c indicate "0" and the signal d indicates "1"). In this case, the switching of capacitance is executed, thereby setting the variable capacitance 13 to a high capacitance. Alternatively, the switching of the resistance is executed, thereby setting the variable resistance 14 to a low resistance.

When the voltage level of the internal voltage v3 is ultra-low, i.e., without reaching the ultra-upper reference voltage, the upper reference voltage, the lower reference voltage, arid the ultra-lower reference voltage, the data on monitoring the internal voltage indicates "0000" (all the signals a, b, c, and d indicate "0"). In this case, the supply of the system clock cclk to the internal circuit 101 is interlocked.

Figure 17:
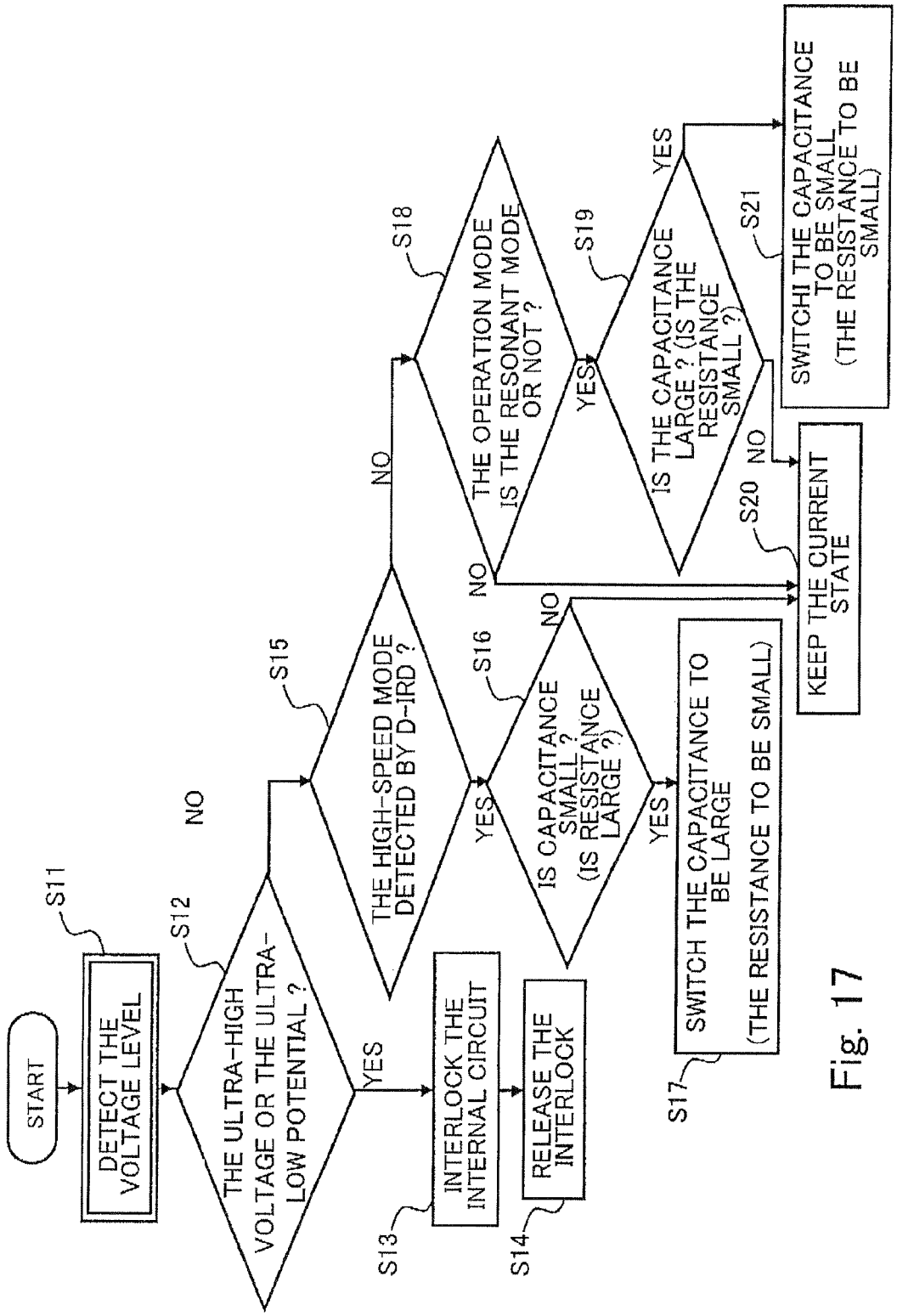
FIG. 17 is a flowchart for illustrating switching control operation.

A description will be given of the switching control by using the capacitance switching determining circuit 110 in the first circuit structure of the LSI 100 shown in FIG. 8 and the resistance switching determining circuit 120 in the second circuit structure of the LSI 200 shown in FIG. 13. FIG. 17 is a flowchart for illustrating the switching control operation. A description will be given of the switching control of the capacitance switching determining circuit 110 shown in FIG. 8 with reference to FIG. 17. However, since the switching control of the resistance switching determining circuit 120 shown in FIG. 13 is the same as that of the capacitance switching determining circuit 110 shown in FIG. 8, a control target of the resistance switching determining circuit 120 is shown between parentheses, and a specific description thereof is omitted.

Referring to FIG. 17, the capacitance switching determining circuit 110 detects the voltage level (in step S11), and then it is determined whether the voltage level is the ultra-high voltage or the ultra-low voltage (in step S12).

When the voltage level is the ultra-high voltage or the ultra-low voltage, the interlock signal for interlocking the internal circuit 101 is transmitted to the clock generating circuit 102 and the supply to the internal circuit 101 of the system clock sclk intermittently stops (in step S13). The capacitance switching determining circuit 110 transmits the interlock signal for a predetermined time, thereby stably setting the internal circuit 101 to the target voltage. After a predetermined period, an interlock signal for instructing the reset of interlocking is transmitted to the clock generating circuit 102, thereby restarting the supply to the internal circuit 101 of the system clock sclk (in step S14). Thereafter, the voltage level is detected and the operation starts from step S11.

In step S12, it is determined whether or not the operation mode is the high-speed mode detected by D-IRD (in step S15). When it is determined that the operation mode is the high-speed mode, the capacitance switching determining circuit 110 determines whether or not the capacitance is low (in step S16). When the capacitance is low, the capacitance switching determining circuit 110 controls the switching of the variable capacitance 13 to be high (in step S17). In the switching control of the resistance switching determining circuit 120, the switching control of the variable resistance 14 to have a low resistance is performed. Thereafter, the voltage level is detected and the operation starts from step S11.

On the other hand, when the capacitance is not low in step S16, the variable capacitance 13 keeps the current state (in step S20). Similarly in the switching control of the resistance switching determining circuit 120, the variable resistance 14 keeps the current state. Thereafter, the voltage level is detected and the operation then starts from step S11.

When it is determined in step S15 that the operation mode is not the high-speed mode, it is determined whether or not the operation mode is the resonant mode (in step S18). When it is determined that the operation mode is the resonant mode, the capacitance switching determining circuit 110 determines whether or not the capacitance is high (in step S19). When it is determined the capacitance is high, the capacitance switching determining circuit 110 controls the switching of the variable capacitance 13 to be low (in step S21). In the switching control of the resistance switching determining circuit 120, the switching control of the variable resistance 14 to have a high resistance is performed. Thereafter, the voltage level is detected and then the operation starts from step S11.

On the other hand, when it is determined in step S19 that the capacitance is not high, the variable capacitance 13 keeps the current state (in step S20). Similarly to the switching control with the resistance switching determining circuit 120, the variable resistance 14 keeps the current state. Thereafter, the voltage level is detected and the operation from step S11 starts.

When it is determined in step S18 that the operation mode is not the resonant mode, the variable capacitance 13 keeps the current state (in step S20). Similarly to the switching control with the resistance switching determining circuit 120, the variable resistance 14 keeps the current state. Thereafter, the voltage level is detected that the operation then starts from step S11.

Figures 18A, 18B:
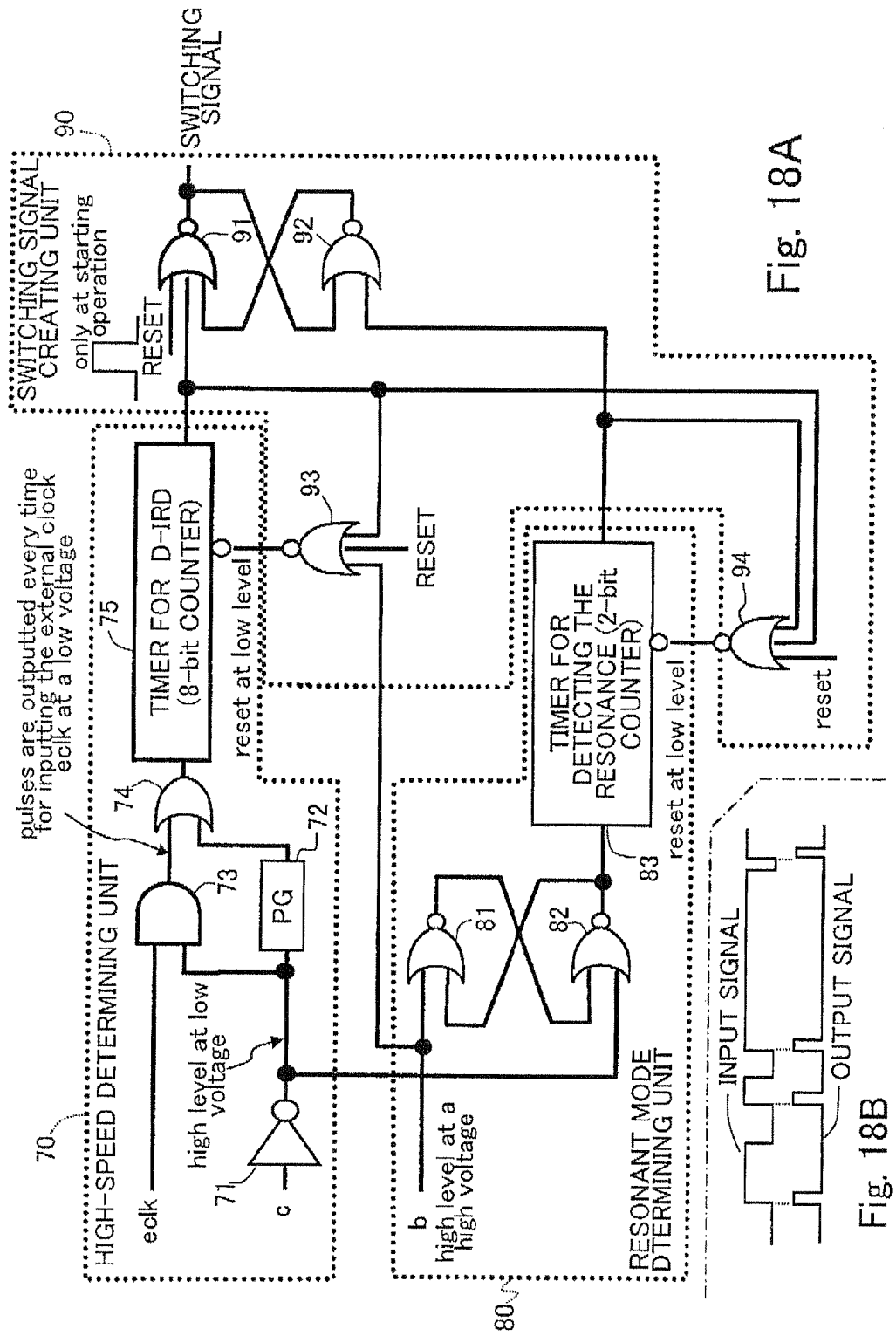
FIGS. 18A and 18B are diagram showing an example of a circuit structure for determining an operation mode and controlling switching thereof on the basis of the change hi internal voltage.

A description will be given of the circuit structure for realizing the operation of the switching control shown in FIG. 17 with reference to FIGS. 18A to 19. FIGS. 18A and 18B are diagrams showing an example of a circuit structure for determining the operation mode on the basis of the change in internal voltage and performing the switching control. Referring to FIG. 18A, the capacitance switching determining circuit 110 and the resistance switching determining circuit 120 comprise: high-speed mode determining units 70; resonant mode determining units 80; and switching signal creating units 90, respectively, so as to determine the operation mode on the basis of the change in internal voltage and perform the switching control.

The high-speed mode determining unit 70 is a circuit structuring unit that determines the high-speed mode by detecting D-IRD, and comprises: an NOT circuit 71; a pulse generator (PG) circuit 72; an AND circuit 73; an OR circuit 74; and a timer 75 for D-IRD.

The NOT circuit 71 inverses the signal c indicating that the voltage is not less than the target voltage, and the inversed signal is inputted to the PG circuit 72 and the AND circuit 73. The signal c is inversed by the NOT circuit 71, thereby being set to the high level at the time of the low voltage.

Referring to FIG. 18B, the PG circuit 72 outputs one shot pulse every time for detecting a high edge of the input signal from the NOT circuit 71.

The AND circuit 73 inputs the external clock eclk and the signal c inversed by the NOT circuit 71, and outputs a result of AND operation to the OR circuit 74. Therefore, at the time of the low voltage, pulses are outputted every time for inputting the external clock eclk.

The OR circuit 74 inputs the one shot pulse from the PG circuit 72 and an output signal from the AND circuit 73, outputs a result of OR operation to the counter 75 for D-IRD, and increments the result.

The counter 75 for D-IRD is, for example, an 8-bit counter, and the signal at the high level is supplied to the switching signal creating unit 90 after ending the counting. The counter 75 for D-IRD is reset by the switching signal creating unit 90 at the low level, and the counting restarts.

The resonant mode determining unit 80 is a circuit structuring unit that determines the resonant mode by detecting the resonant frequency moving between the high voltage and the low voltage, and comprises: an NOR circuit 81; an NOR circuit 82; and a timer 83 for detecting the resonance.

The NOR circuit 81 inputs the signal b indicating that the voltage level is the high voltage or more and the output signal from the NOR circuit 82, and further outputs a result of NOR operation to the NOR circuit 82.

The NOR circuit 82 inputs the output signal from the NOR circuit 81 and the signal c inversed by the NOT circuit 71 in the high-speed mode determining unit 70, and outputs a result of NOR operation to the timer 83 for detecting the resonance. The output signal from the NOR circuit 82 is high when it is detected that the voltage level changes from the target voltage to the high voltage, and is low when it is detected that the voltage level changes from the target voltage to the low voltage. The timer 83 for detecting the resonance increments a timer value every time for detecting the high voltage in response to an output from the NOR circuit 82, that is, an output signal at the high level from the NOR circuit 82.

The timer 83 for detecting the resonance is, e.g., 2-bit counter, and the signal at the high level is supplied to the switching signal creating unit 90 after ending the counting. The tinier 83 for detecting the resonance is reset at the low level by the switching signal creating unit 90, and the counting then restarts.

The switching signal creating unit 90 controls the timer 75 for D-IRD in the high-speed mode determining unit 70 and the timer 83 for detecting the resonance in the resonant mode determining unit 80, thereby generating and outputting a switching signal. The switching signal indicates the capacitance switching signal in the first circuit structure of the LSI 100 shown in FIG. 8, and further indicates the resistance switching signal in the second circuit structure of the LSI 200 shown in FIG. 13. The switching signal creating unit 90 comprises NOR circuits 91 to 94.

In the switching signal creating unit 90, the output signal from the timer 75 for D-IRD in the high-speed mode determining unit 70 is inputted to the NOR circuits 91, 93, and 94, and an output signal from the timer 83 for detecting the resonance in the resonant mode determining unit 80 is inputted to the NOR circuits 92 and 94.

The NOR circuit 91 inputs an output signal from the timer 75 for D-IRD in the high-speed mode determining unit 70, an output signal from the NOR circuit 92, and a reset signal at the start time, and outputs a result of NOR operation as the switching signal. The switching signal outputted is also inputted to the NOR circuit 92.

The NOR circuit 92 inputs a result of NOR operation of the NOR circuit 91 and an output signal from the timer 83 for detecting the resonance in the resonant mode determining unit 80, and further inputs a result of NOR operation to the NOR circuit 91.

Therefore, the switching signal outputted from NOR circuit 91 is low in the high-speed mode, and is further high in the resonant mode. In the first circuit structure of the LSI 100 in FIG. 8, the variable capacitance 13 is switched to a high one by the switching signal indicating the low level, and is further switched to a low capacitance by the switching signal indicating the high level. On the other hand, in the second circuit structure of the LSI 200 shown in FIG. 13, the variable resistance 14 is switched to a low resistance by the switching signal indicating the low level, and is further switched to a high resistance by the switching signal Indicating the high level.

The NOR circuit 93 resets the timer 75 for D-IRD at the low level at the start time, at the time for determining the high-speed mode, or at the time for determining in the low-speed mode.

The NOR circuit 94 resets the timer 83 for detecting the resonance at the low level at the start time, at the time for determining the high-speed mode, or at the time for determining in the low-speed mode.

Figure 19:
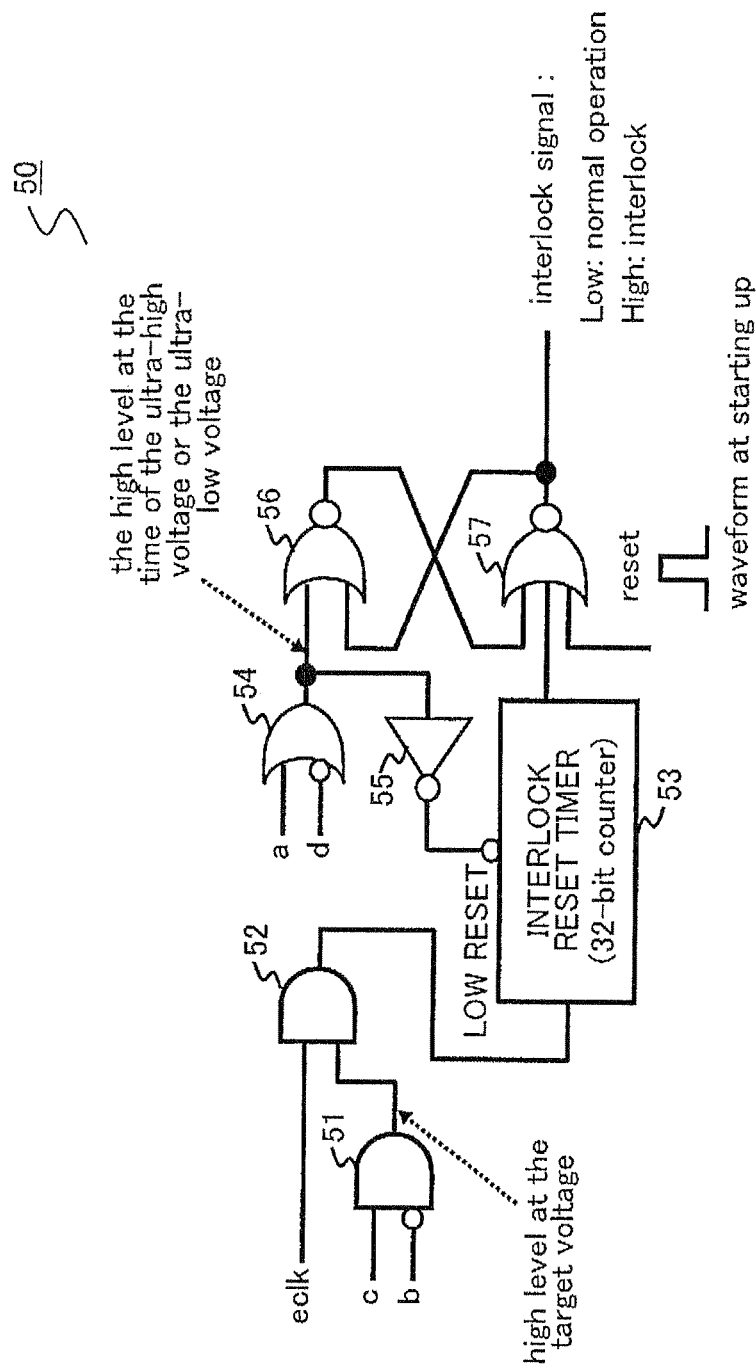
FIG. 19 is a diagram showing an example of a circuit structure for interlock control of an internal circuit on the basis of the change in internal voltage.

FIG. 19 is a diagram showing an example of a circuit structure for interlocking control of the internal circuit 101 based on the change in internal voltage. Referring to FIG. 19, the capacitance switching determining circuit 110 and the resistance switching determining Circuit 120 individually comprise: interlock signal creating units 50 that create interlock signals for interlocking the internal circuit 101 on the basis of the change in internal voltage in addition to the circuit structure shown in FIG. 18A.

The interlock signal creating unit 50 comprises: an AND circuit 51; an AND circuit 52; an interlock reset timer 53; an OR circuit 54; an NOT circuit 55; an NOR circuit 56; and an NOR circuit 57.

The AND circuit 51 inputs the signal c indicating that the voltage level is not less than the target voltage and inverses and inputs the signal b indicating that the voltage level is not less than the high voltage, and outputs a result of AND operation to the AND circuit 52. The AND circuit 51 outputs the signal at the high level at the time of the high target voltage. The AND circuit 52 inputs the external clock eclk and an output from the AND circuit 51, outputs a result of AND operation to the interlock reset timer 53, and increments the output.

The interlock reset timer 53 is, e.g., 32-bit counter, and is a timer used for keeping the target voltage by the internal circuit 101 for a predetermined period after interlocking the internal circuit 101. The interlock reset timer 53 is incremented synchronously with the external clock elck during detecting the target voltage, and outputs a signal at the high level to the NOR circuit 57 after ending the counting. Upon detecting the ultra-high voltage or the ultra-low voltage, the NOT circuit 55 resets the operation mode at the low level and restarts the counting.

The OR circuit 54 inputs the signal "a" indicating that the voltage level is not less than the ultra-high voltage, inverses the signal d indicating the voltage level is not more than the ultra-low voltage and further inputs the inversed signal d, and outputs a signal at the high level at the time of the ultra-high voltage or the ultra-low voltage with OR operation. The signal outputted from the OR circuit 54 is inputted to the NOT circuit 55 and the NOR circuit 56.

The NOT circuit 55 inputs an output signal from the OR circuit 54, and further outputs a result of NOT operation to the interlock reset timer 53, thereby resetting the interlock reset timer 53 at the low level when the voltage level is the ultra-high voltage or the ultra-low voltage.

The NOR circuit 56 inputs the output signal from the OR circuit 54 and the interlock signal outputted from the NOR circuit 57, acid outputs a result of NOR operation to the NOR circuit 57.

The NOR circuit 57 inputs an output signal from the NOR circuit 56, an output signal indicating the reset of the interlock reset timer 53, and a reset signal at the start time, and sets a result of NOR operation as the interlock signal and further outputs the set result to the clock generating circuit 102. The outputted interlock signal is also inputted to the NOR circuit 56.

Therefore, the interlock signal outputted from the NOR circuit 57 is low at the time of the normal operation of the internal circuit 101, and is high when the internal circuit 101 is interlocked.

Figure 20:
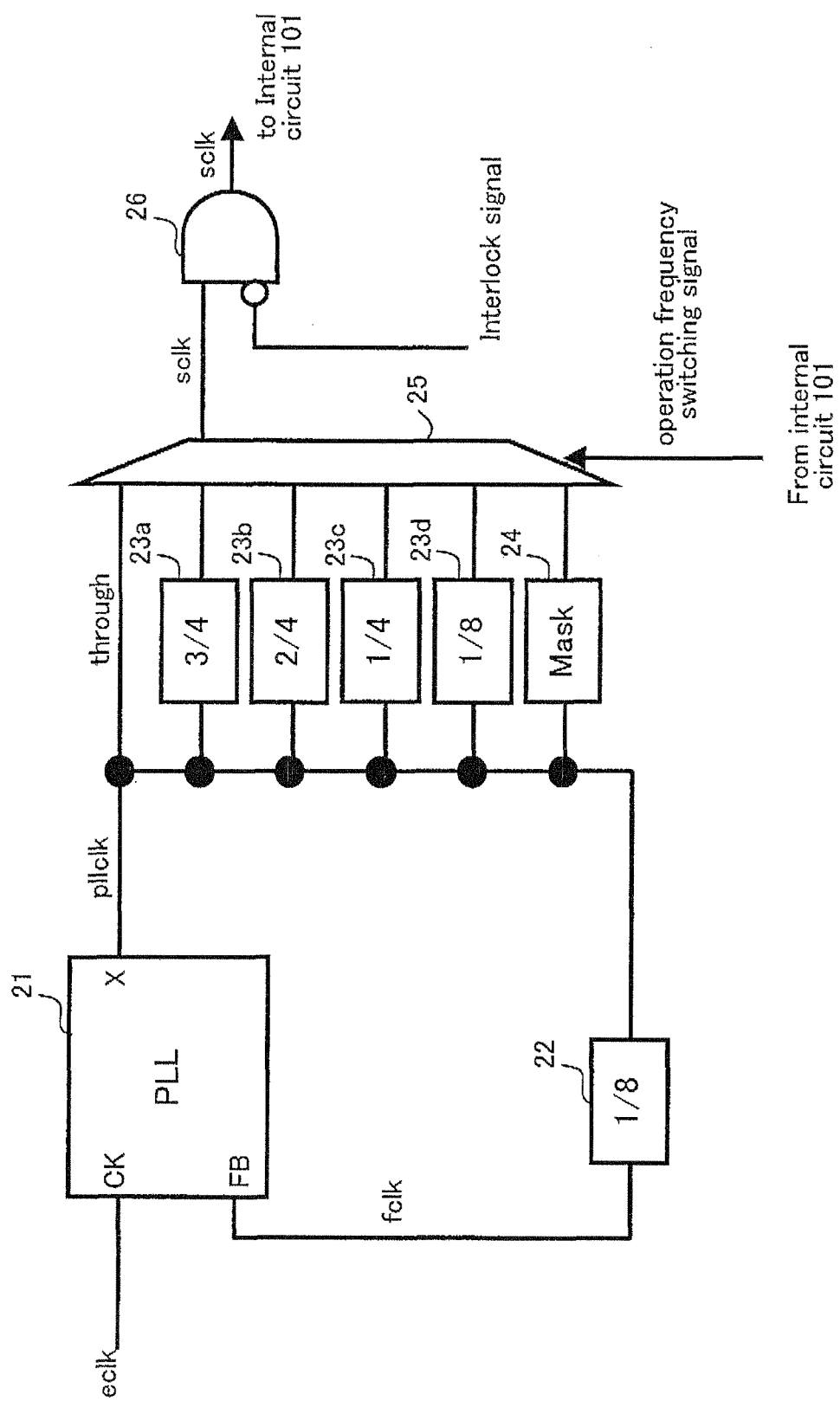
FIG. 20 is a diagram showing a circuit structure of a clock generating circuit.

Next, a description will be given of the clock generating circuit 102. The circuit structure of the clock generating circuit 102 is similar both in the first circuit structure of the LSI 100 shown in FIG. 8 and in the second circuit structure of the LSI 200 shown in FIG. 13. FIG. 20 is a diagram showing the circuit structure of the clock generating circuit 102. Referring to FIG. 20, the clock generating circuit 102 comprises: a Phase Locked Loop (PLL) circuit 21; a divider 22 for feedback clock; dividers 23a, 23b, 23c, and 23d for switching the frequency; a mask 24 for shutting-off the clock; a selector 25 for selecting the operation frequency; and an AND circuit 26.

The PLL circuit 21 adjusts the phase of the external clock eclk with a feedback clock fclk, and creates an output clock pllclk and transmits the created clock to the selector 25. For example, the output clock pllclk with 400 MHz is created from the external clock eclk with 50 MHz.

The divider 23a enables, by frequency division, ¾ of the frequency of the clock pllclk outputted to the selector 25 with 400 MHz, thereby obtaining 300 MHz. Further, the divider 23b enables, by frequency division, ²⁄₄ of the frequency of the clock pllclk outputted to the selector 25 with 400 MHz, thereby obtaining 200 MHz. Furthermore, the divider 23c enables, by frequency division, ¼ of the frequency of the clock pllclk outputted to the selector 25 with 400 MHz, thereby obtaining 100 MHz. In addition, the divider 23d enables, by frequency division, ⅛ of the frequency of the clock pllclk outputted to the selector 25 with 400 MHz, thereby obtaining 50 MHz. In addition, the mask 24 shuts-off the frequency division and then supplies the divided frequencies to the selector 25.

The selector 25 has input terminals for 400 MHz, 300 MHz, 200 MHz, 100 MHz, and 50 MHz and an input terminal for the shut-off output clock pllclk. The selector 25 selects the input terminal in accordance with the operation frequency switching signal from the internal circuit 101, and outputs the selected terminal as the system clock sclk.

The AND circuit 26 inputs the system clock sclk outputted from the selector 25, inverses the interlock signal and further inputs the inversed signal, performs AND operation, and supplies the system clock sclk to the internal circuit 101. When the voltage level is the ultra-high voltage or the ultra-low voltage, the supply of the system clock sclk stops.

Figure 21:
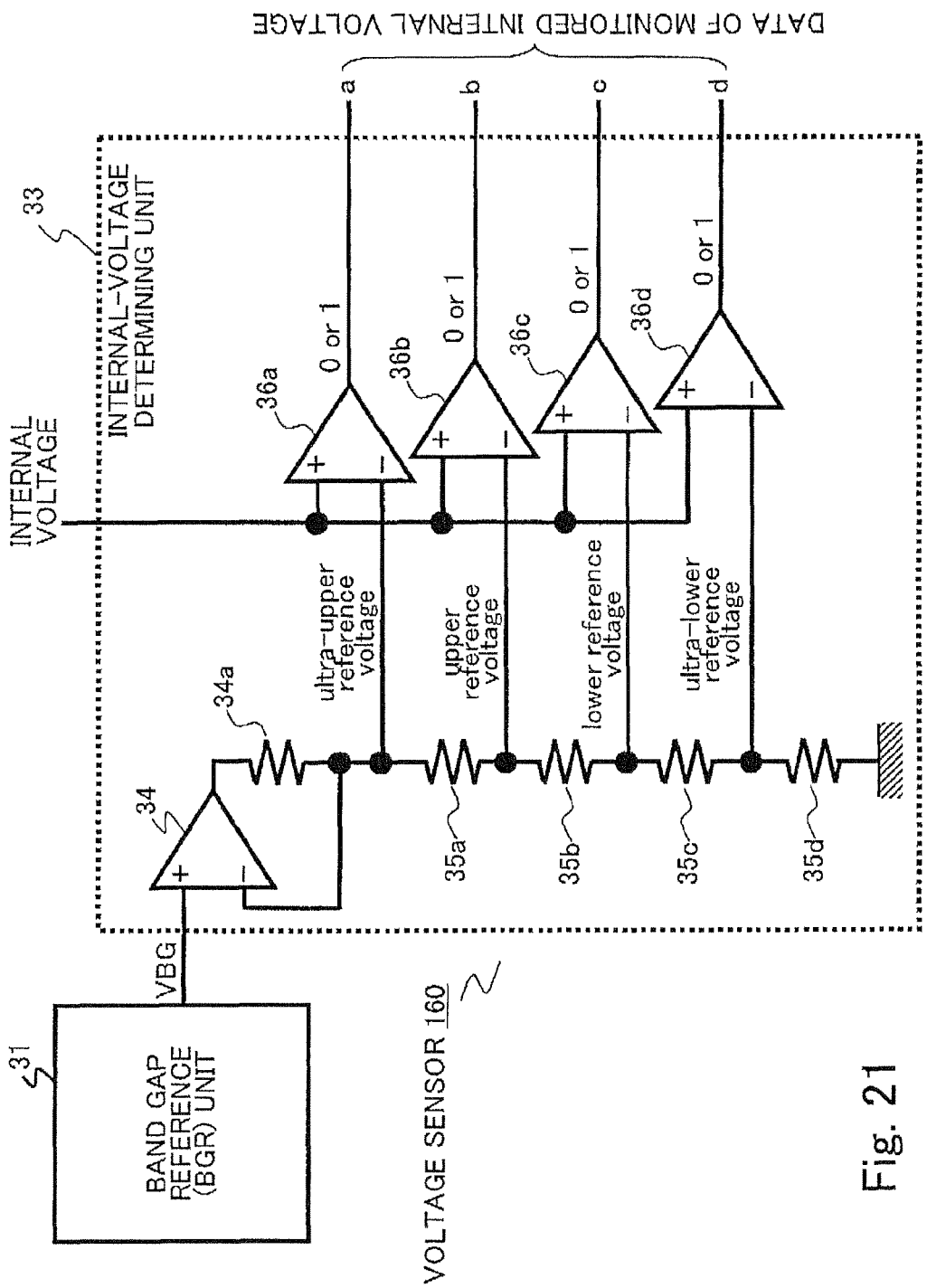
FIG. 21 is a diagram showing a circuit structure of a voltage sensor using a bandgap reference.

Next, the voltage sensor 160 will be described. The circuit structure of the voltage sensor 160 is similar both in the first circuit structure of the LSI 100 shown in FIG. 8 and in the second circuit structure of the LSI 200 shown in FIG. 13. FIG. 21 is a diagram showing the circuit structure of the voltage sensor 160 using a bandgap reference. The voltage sensor 160 shown in FIG. 21 comprises: a bandgap reference (BGR) unit 31; and an internal-voltage determining unit 33.

The BGR unit 31 creates a voltage VBG with high accuracy, and supplies the created voltage to the internal-voltage determining unit 33. The voltage VBG is higher than the ultra-upper reference voltage.

The internal-voltage determining unit 33 comprises: an operational amplifier 34; a resistance 34a; resistances 35a to 35d; and comparators 36a to 36d. The comparators 36a to 36d A/D convert signals and output comparison results thereof.

The voltage VBG created by the BGR unit 31 is applied to the operational amplifier 34, and the resistance 34a enables the voltage VBG to be the ultra-upper reference voltage. The resistance 35a enables the ultra-upper reference voltage to be the upper reference voltage. The resistance 35b enables the upper reference voltage to be the lower reference voltage. The resistance 35c enables the lower reference voltage to be the ultra-lower reference voltage. The resistance 35d further enables the ultra-lower reference voltage to be the low voltage and the low voltage then is connected to the ground. The ultra-upper reference voltage is applied to the comparator 36a, the upper reference voltage is applied to the comparator 36b, the lower reference voltage is applied to the comparator 36c, and the ultra-lower reference voltage is applied to the comparator 36d.

The comparator 36a outputs, as the signal "a", a comparison result between the internal voltage v and the ultra-upper reference voltage. When the internal voltage v is not less than the ultra-upper reference voltage the signal "a" indicates 1. When the internal voltage v is not more than the ultra-upper reference voltage, the signal "a" indicates 0.

The comparator 36b outputs, as the signal b, a comparison result between the internal voltage v and the upper reference voltage. When the internal voltage v is not less than the upper reference voltage, the signal b indicates 1. When the internal voltage v is not less than the upper reference voltage, the signal b indicates 0.

The comparator 36c outputs, as the signal c, a comparison result between the internal voltage v and the lower reference voltage. When the internal voltage v is not less than the lower reference voltage, the signal c indicates 1. When the internal voltage v is not less than the lower reference voltage, the signal c indicates 0.

The comparator 36d outputs, as the signal d, a comparison result between the internal voltage v and the ultra-lower reference voltage. When the internal voltage v is not less than the ultra-lower reference voltage, the signal d indicates 1. When the internal voltage v is less than the ultra-lower reference voltage, the signal d indicates 0.

The circuit structure is provided, thereby recognizing five voltage levels shown in FIG. 16.

Figure 22:
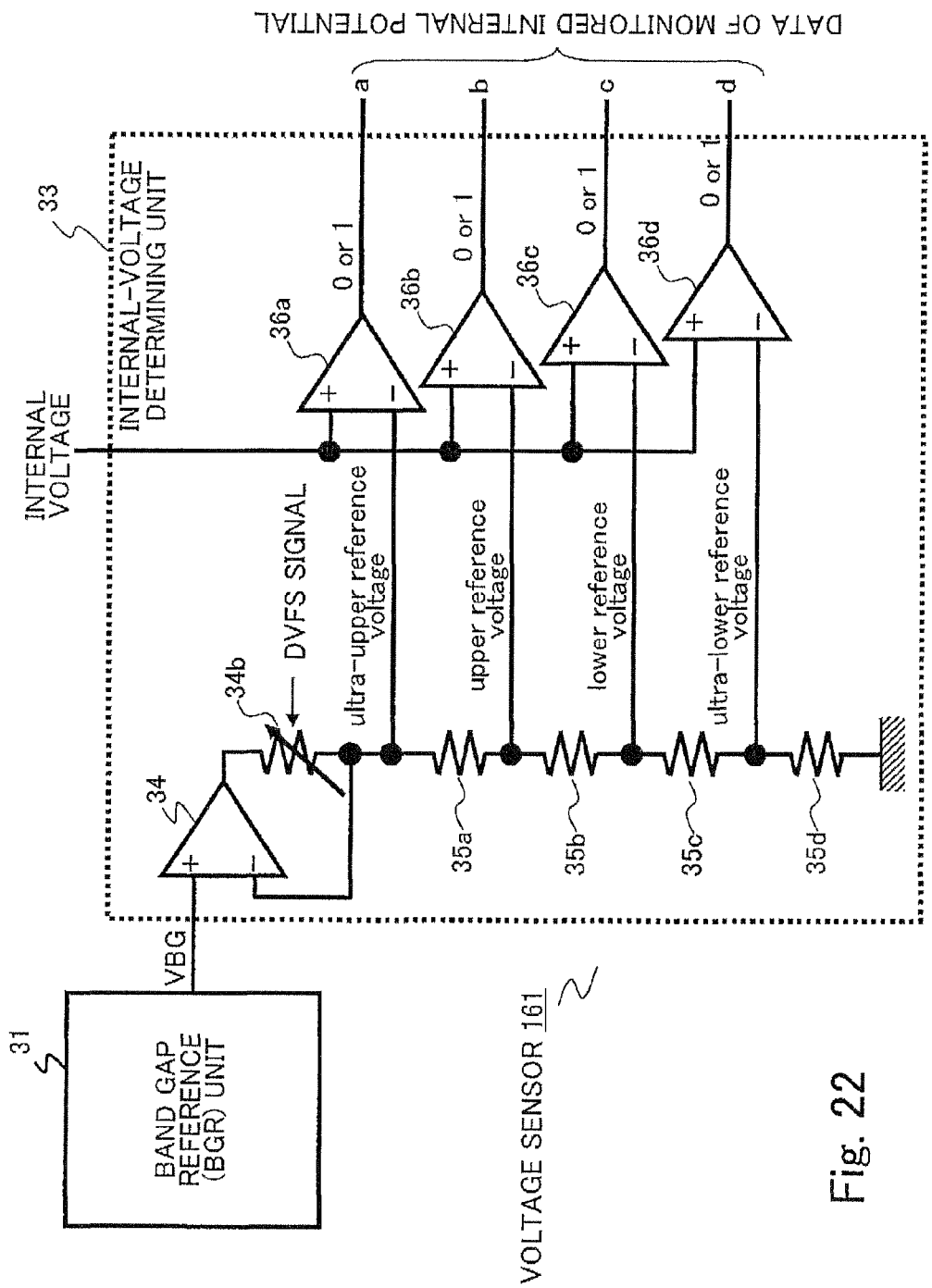
FIG. 22 is a diagram showing a circuit structure of a voltage sensor when a target voltage is variable.

A description will be given of another circuit structure of the voltage sensor 160 with reference to FIGS. 22 to 25. FIG. 22 is a diagram showing the circuit structure of a voltage sensor when the target voltage is variable. The same portions in FIG. 22 as those in FIG. 21 are designated by the same reference numerals, and a description thereof will be omitted. A voltage sensor 161 shown in FIG. 22 has the circuit structure similar to that of the voltage sensor 160 shown in FIG. 21, excluding a variable resistance 34b provided for the internal-voltage determining unit 33 in place of the resistance 34a shown in FIG. 21.

The variable resistance 34b is provided, thereby changing reference voltages in response to the change in external source voltage in further lower power consumption with Dynamic Voltage and Frequency Scaling (DVFS) used while reducing the external source voltage of the LSI 100 (or 200).

Figure 23:
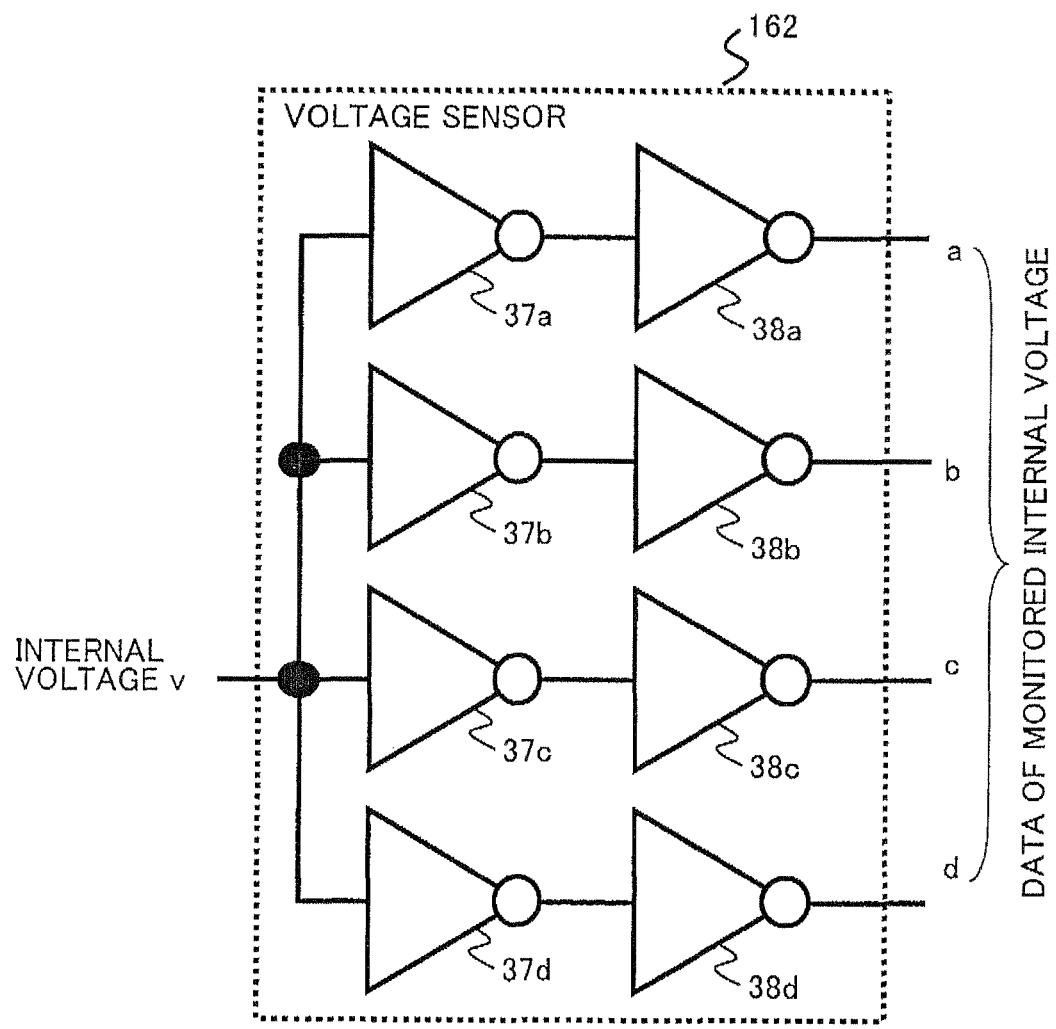
FIG. 23 is a diagram showing a circuit structure of a voltage sensor using logic circuits.

FIG. 23 is a diagram showing the circuit structure of a voltage sensor using logic circuits. A voltage sensor 162 shown in FIG. 23 comprises: an NOT circuit 37a that sets the ultra-upper reference voltage as a threshold A; an NOT circuit 37b that sets the upper reference voltage as a threshold B; an NOT circuit 37c that sets the lower reference voltage as a threshold C; an NOT circuit 37d that sets the ultra-lower reference voltage as a threshold D; an NOT circuit 38a that outputs the signal "a"; an NOT circuit 38b that outputs the signal b; an NOT circuit 38c that outputs the signal c; and an NOT circuit 38d that outputs the signal d.

The NOT circuit 37a performs NOT operation of the inputted internal voltage v with the threshold A as the ultra-upper reference voltage, and outputs an operation result thereof to the NOT circuit 38a. The NOT circuit 38a further performs NOT operation, thereby outputting the signal "a".

The NOT circuit 37b performs NOT operation of the inputted internal voltage v with the threshold B as the upper reference voltage, and outputs an operation result thereof to the NOT circuit 38b. The NOT circuit 38b further performs NOT operation, thereby outputting the signal b.

The NOT circuit 37c performs NOT operation of the inputted internal voltage v with the threshold C as the upper reference voltage, and outputs an operation result thereof to the NOT circuit 38c. The NOT circuit 38c further performs NOT operation, thereby outputting the signal c.

The NOT circuit 37d performs NOT operation of the inputted internal voltage v with the threshold D as the upper reference voltage, and outputs an operation result thereof to the NOT circuit 38d. The NOT circuit 38d further performs NOT operation, thereby outputting the signal d.

The thresholds A to D of the inverters are provided, thereby the BGR unit 31 shown in FIG. 22 becomes unnecessary and the chip sharing area is reduced.

Figure 24:
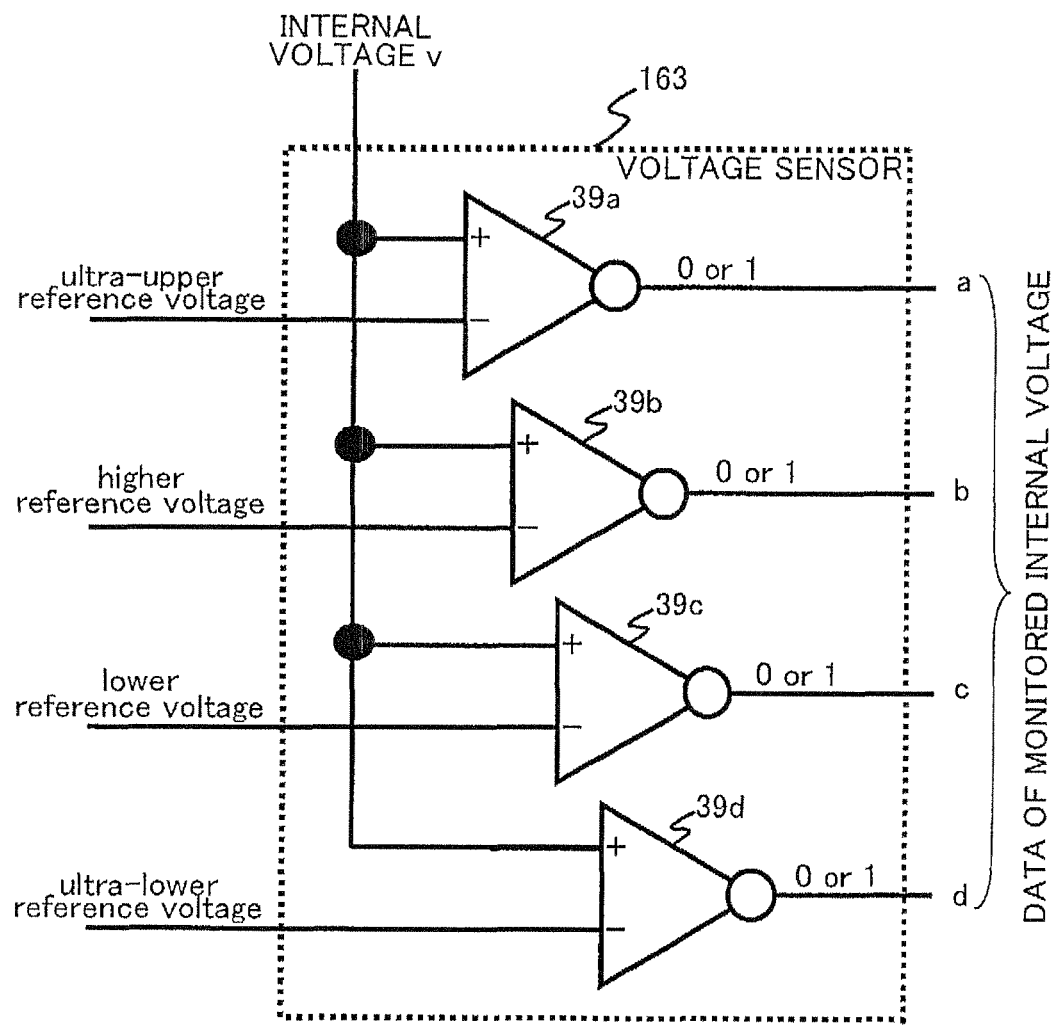
FIG. 24 is a diagram showing a circuit structure of a voltage sensor using comparators.

FIG. 24 is a diagram showing the circuit structure of a voltage sensor using the comparator. A voltage sensor 163 shown in FIG. 24 comprises a comparator 39a; a comparator 39b; a comparator 39c; and a comparator 39d. The comparators 39a to 39d A/D-convert the data.

The voltage sensor 163 has the circuit structure without the BGR unit 31, and the ultra-upper reference voltage to the ultra-lower reference voltage are individually applied to the comparators 39a to 39d out of the LSI.

Further, the comparators 39a to 39d output results in comparison with the internal voltage v as the signals "a" to "d".

Figure 25:
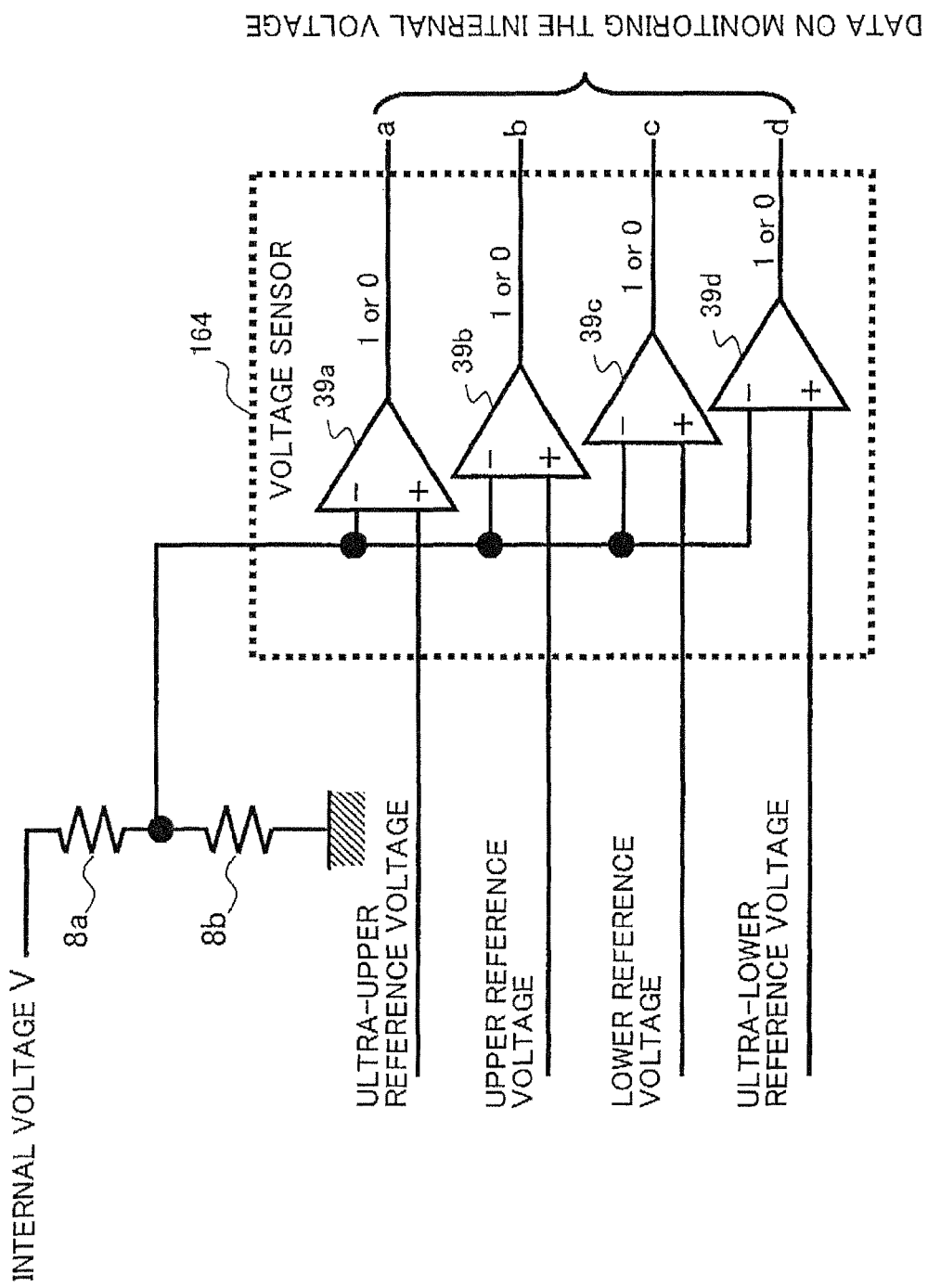
FIG. 25 is a diagram showing a modification of the voltage sensor showing in FIG. 24.

FIG. 25 is a diagram showing a modification of the voltage sensor shown in FIG. 24. The same portions in FIG. 24 as those in FIG. 25 are designated by the same reference numerals, and a description thereof will be omitted. Unlike the voltage sensor 163 shown in FIG. 24, the internal voltage v is decreased and is supplied to a voltage sensor 164 by a resistance 8a. The internal voltage v is further set to the low voltage by a resistance 8b, and is then connected to the ground.

Upon measuring one voltage, a source voltage to be applied to a measuring circuit thereof generally needs to be sufficiently higher than a measurement voltage. By decreasing the measurement voltage in advance, the source voltage and the measurement voltage to be applied to the voltage sensor can be identical to each other.

Figure 26:
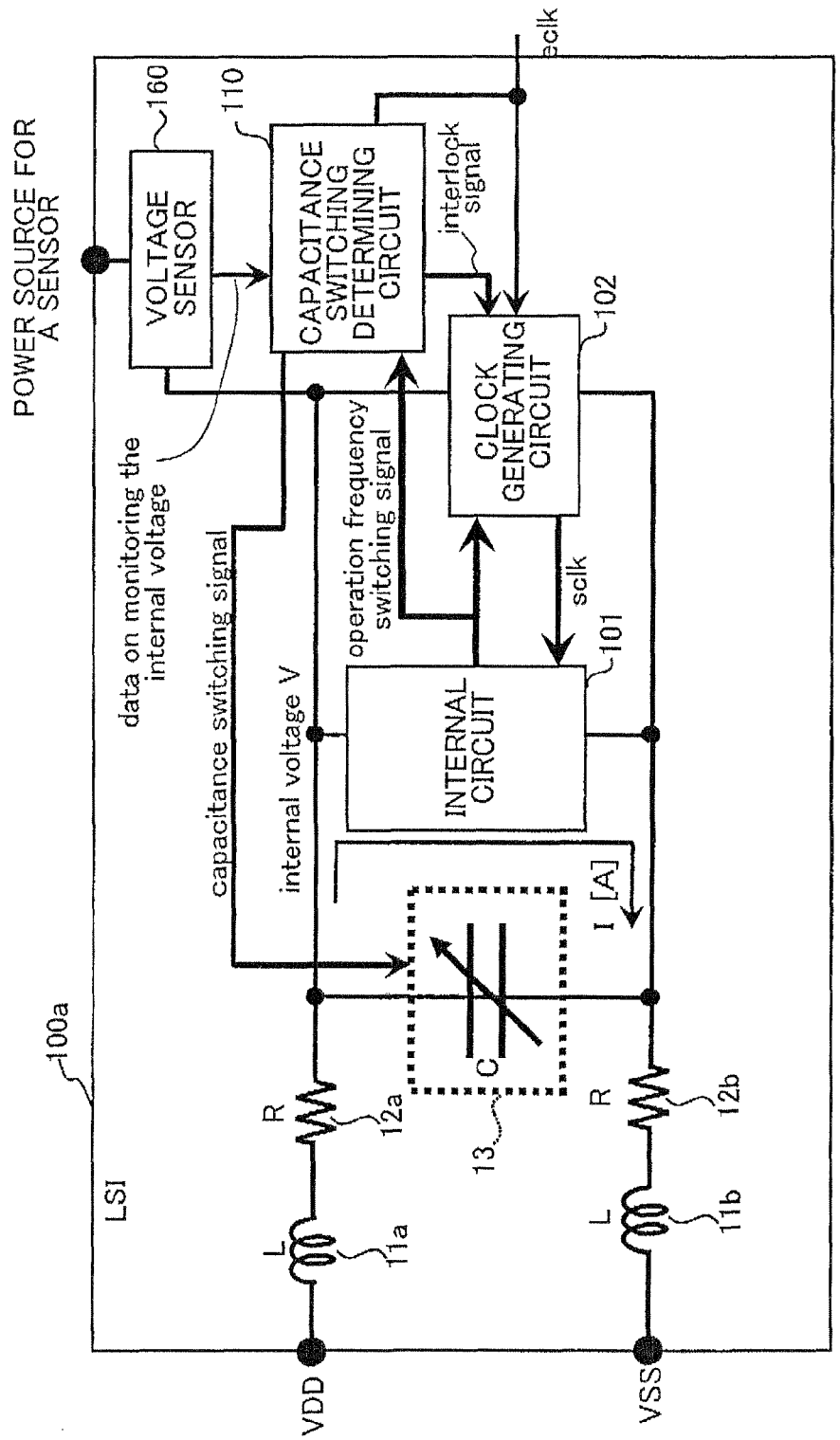
FIGS. 26 is a diagram showing an example of a third circuit structure of an LSI for controlling a capacitance in accordance with the change in internal voltage.

FIG. 26 is a diagram showing an example of a third circuit structure of the LSI that controls the capacitance in accordance with the change in internal voltage. In FIG. 26, the circuit structure of an LSI 100a is similar to the first circuit structure shown in FIG. 8. Therefore, the same reference numerals in FIG. 26 as those in the first circuit structure shown in FIG. 8 denote the same elements and a description thereof will be omitted. The LSI 100a shown in FIG. 26 is different from the first circuit structure shown in FIG. 8 because the operation frequency switching signal from the internal circuit 101 is inputted to the clock generating circuit 102 and the capacitance switching determining circuit 110.

A capacitance switching determining circuit 110 in the LSI 100a includes a rewritable switching table, and stores best values in advance every voltage level indicated by the data on monitoring the internal voltage at the operation frequencies, and controls the switching of the capacitance in accordance with the operation frequency determined by the operation frequency switching signal and the detected voltage level.

Figure 27:
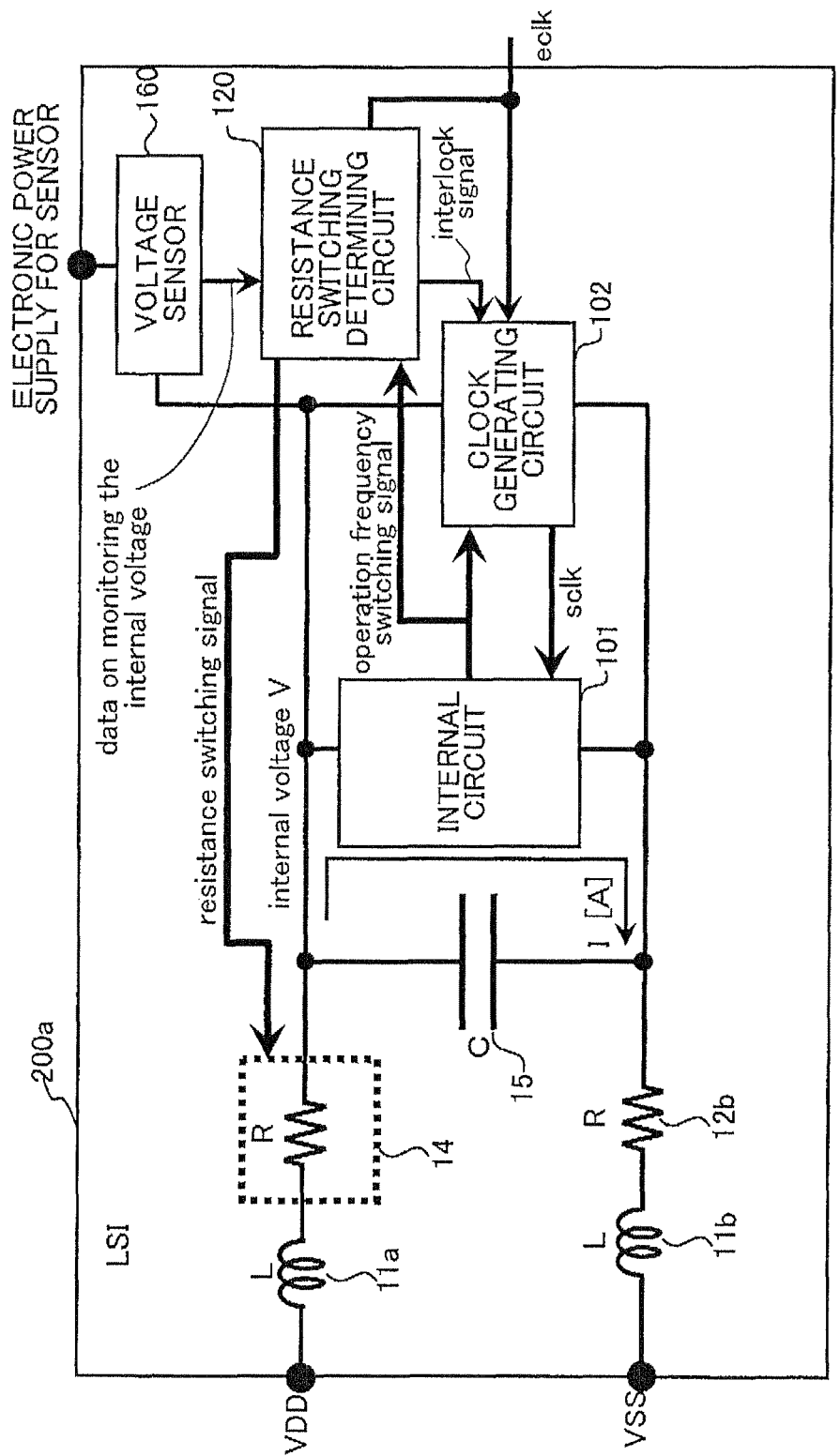
FIG. 27 is a diagram showing an example of a fourth circuit structure of an LSI for controlling a resistance in accordance with the change in internal voltage.

FIG. 27 is a diagram showing an example of a fourth circuit structure of the LSI for controlling the resistance in accordance with the change in internal voltage. In FIG. 27, the circuit structure of an LSI 200a is similar to the second circuit structure shown in FIG. 13, the same portions are therefore designated by the same reference numerals, and a specific description thereof will be omitted. The LSI 200a shown in FIG. 27 is different from the second circuit structure shown in FIG. 13 because the operation frequency switching signal from the internal circuit 101 is inputted to the clock generating circuit 102 and the resistance switching determining circuit 110.

The resistance switching determining circuit 120 in the LSI 200a includes a rewritable switching table, stores best values in advance every voltage level represented by the data on monitoring the internal voltage at the operation frequencies, and controls the switching of the resistance in accordance with the operation frequency determined by the operation frequency switching signal and the detected voltage level.

As mentioned above, the change in voltage level is detected by superimposing the power noise to the actual internal voltage. Thus, the operation mode is determined and the best power impedance is selected. Even if using the LSI having a low-lower technology such as DVFS, the power noise can be suppressed and stable operation can be obtained.

Further, even if changing the operation environment of the LSI, such as a system board or application to be operated, the change in internal voltage during the operation is detected, and the best power impedance is selected in accordance with the situation, thereby changing the resonant point to have the frequency hand for preventing the influence on the operation frequency. Alternatively, the resonant point is reduced and the power noise can be therefore suppressed.

Further, upon detecting a dangerous voltage level to physically break the LSI or erase data during the processing thereof, the interlocking system for temporarily stopping the supply of the system clock eclk to the internal circuit 101 is provided, thereby preventing the breaking of the LSI and the erasure of data during the processing thereof. Even if the source voltage to be externally supplied is constant, the dangerous state is prevented by the voltage level in the LSI, and the LSI can be therefore operated with safety.

The present invention is not limited to the embodiments and can be variously modified and changed without departing from the claims.

Example embodiments of the present invention have now been described in accordance with the above advantages. It will be appreciated that these examples are merely illustrative of the invention. Many variations and modifications will be apparent to those skilled in the art.

What is claimed is:

1. A semiconductor integrated circuit, comprising:
   a circuit configured to execute a predetermined process;
   a voltage sensor configured to generate monitor data indicating a variation in a voltage level of the circuit;
   a clock generating circuit configured to generate a clock signal at an operation frequency;
   a judgment circuit configured to output a judgment signal when the monitor data indicates that peak and bottom voltage levels of the variation occur alternately outside a range between upper and lower voltage levels; and
   an impedance changeable circuit configured to change a power impedance for avoiding resonance in accordance with the judgment signal while the clock generating circuit is configured to generate the clock signal at the operation frequency.

2. The semiconductor integrated circuit according to claim 1, wherein the judgment circuit is configured to determine a repeated transition mode of the voltage in accordance with a variation of the voltage level; and
   the impedance changeable circuit is configured to change a power capacitance of a source power corresponding to the circuit in accordance with the transition mode.

3. The semiconductor integrated circuit according to claim 2, wherein the impedance changeable circuit is configured to change a power resistance of a source power corresponding to the circuit in accordance with the transition mode.

4. The semiconductor integrated circuit according to claim 2, wherein the voltage sensor is configured to generate the monitored data indicating a variation in the level of the voltage based on comparison of a reference voltage and the voltage of the circuit and send the monitored data to the judgment circuit, and wherein the judgment circuit is configured to determine a repeated transition mode of the variation in the voltage based on a transition of the monitored data.

5. The semiconductor integrated circuit according to claim 4, wherein the reference voltages is changed according to the variation in the voltage.

6. The semiconductor integrated circuit according to claim 4, wherein the voltage sensor is configured to receive one or more thresholds and monitor two or more voltage levels indicating the variation in the voltages of the circuit.

7. The semiconductor integrated circuit according to claim 4, wherein the reference voltage is supplied to the voltage sensor externally and the voltage sensor is configured to monitor two or more voltage levels indicating the variation in the voltages supplied to the circuit.

8. The semiconductor integrated circuit according to claim 2, wherein the transition status of the voltage includes a first transition state and a second transition state, wherein the judgment circuit is configured to determine one of the first transition state and the second transition state based on the variation in the voltage and determine whether or not to select the power impedance.

9. The semiconductor integrated circuit according to claim 8, wherein the judgment circuit includes a timer and is configured to determine the transition state when a certain variation in voltage continues during a predetermined period.

10. A semiconductor integrated circuit, comprising:
    a circuit configured to execute a predetermined process;
    a voltage sensor configured to monitor a variation in a voltage and generate data indicating a variation in a level of the voltage;
    a clock generating circuit configured to generate a clock signal at an operation frequency;
    a judgment circuit configured to output a judgment signal when the monitor data indicates that peak and bottom voltage levels of the variation occur alternately outside a range between an upper and an lower voltage levels;
    an impedance changeable circuit configured to change a power impedance for avoiding resonance in accordance with the judgment signal while the clock generating circuit is configured to generate the clock signal at the operation frequency; and
    a clock switch circuit configured to switch between a supply of a clock signal to the circuit and a halt of the supply of the clock signal to the circuit for avoiding resonance according to a transition mode.

11. The semiconductor integrated circuit according to claim 10, wherein the voltage sensor is configured to generate data indicating a variation in the level of the voltage based on comparison of a reference voltage and the voltage supplied to the circuit and send the data indicating a variation in the level of the voltage to the judgment circuit.

12. The semiconductor integrated circuit according to claim 11, wherein the reference voltage is changed according to the variation in the voltage.

13. The semiconductor integrated circuit according to claim 11, wherein the sensor is configured to receive one or more thresholds and monitor two or more voltage levels indicating the variation in the voltage supplied to the circuit.

14. The semiconductor integrated circuit according to claim 11, wherein the reference voltage is provided to the sensor externally and the voltage sensor is configured to monitor the level of the voltage indicating the variation in the voltage supplied to the circuit.

15. The semiconductor integrated circuit according to claim 10, wherein the judgment circuit is configured to determine a plurality of repeated transition modes of the variation in the voltage and determine one of the plurality of transition modes based on the variation in the voltage.

16. The semiconductor integrated circuit according to claim 10, wherein the judgment circuit includes a timer and is configured to determine one of a plurality of transition modes of the variation in the voltages when a certain variation in voltages continues during a predetermined period.

* * * * *